United States Patent [19]
Dent et al.

[11] Patent Number: 5,745,523
[45] Date of Patent: Apr. 28, 1998

[54] MULTI-MODE SIGNAL PROCESSING

[75] Inventors: Paul W. Dent, Stehag; Björn Olof Peter Ekelund, Lund, both of Sweden

[73] Assignee: Ericsson Inc., Research Triangle Park, N.C.

[21] Appl. No.: 967,027

[22] Filed: Oct. 27, 1992

[51] Int. Cl.$^6$ .......................... H04L 27/34; H04L 27/36; H04L 27/38
[52] U.S. Cl. .......................... 375/216; 375/219; 375/298; 375/324; 375/340; 332/103; 332/117; 364/180; 455/74
[58] Field of Search .......................... 375/216, 219, 375/222, 249, 250, 324, 295, 298, 340, 325, 302, 308; 379/58, 63, 59; 455/142, 33.1, 54.1, 87, 83, 93, 84, 74; 364/178, 180, 135; 332/103, 117, 144; 329/304, 315, 317, 344

[56] References Cited

U.S. PATENT DOCUMENTS

| | | | |
|---|---|---|---|
| 2,967,992 | 1/1961 | Scholten | 323/66 |
| 3,602,818 | 8/1971 | Anderlecht et al. | 455/72 |
| 3,906,166 | 9/1975 | Cooper et al. | 379/60 |
| 3,949,299 | 4/1976 | Song | 375/250 |
| 4,355,407 | 10/1982 | Ikoma et al. | 375/337 |
| 4,400,585 | 8/1983 | Kaman et al. | 379/63 |
| 4,455,676 | 6/1984 | Kaneda | 381/106 |
| 4,493,091 | 1/1985 | Gundry | 375/249 |
| 4,713,808 | 12/1987 | Gaskill et al. | 370/314 |
| 4,750,198 | 6/1988 | Harper | 379/59 |
| 4,825,448 | 4/1989 | Critchlow et al. | 375/222 |
| 4,835,792 | 5/1989 | Davarian | 375/324 |
| 4,850,033 | 7/1989 | Eizenhöfer et al. | 455/33.2 |
| 4,857,915 | 8/1989 | Andros et al. | 340/825.44 |
| 4,903,319 | 2/1990 | Kasai et al. | 455/33.2 |
| 4,903,320 | 2/1990 | Hanawa | 455/34.2 |
| 4,989,230 | 1/1991 | Gillig et al. | 379/59 |
| 4,996,696 | 2/1991 | McCabe | 375/249 |
| 5,008,925 | 4/1991 | Pireh | 379/60 |

(List continued on next page.)

FOREIGN PATENT DOCUMENTS

| | | |
|---|---|---|
| 0 425 458 | 5/1991 | European Pat. Off. . |
| 0 502 546 | 9/1992 | European Pat. Off. . |
| 60-46139 | 3/1985 | Japan . |
| WO 92/02991 | 2/1992 | WIPO . |

OTHER PUBLICATIONS

Tarallo et al., "Modulation Techniques for Digital Cellular Systems," 38th IEEE Veh. Tech. Conf., 1988, pp. 245–248.

"Audio compander squelches hiss and hum better than Dolby system", *Electronics*, vol. 52, No. 4, Feb. 15, 1979, pp. 70, 72.

R. Fisher, "Dual Mode Mobile Unit for Next Generation Digital Narrow Channel Cellular Telephone System," 38th IEEE Vehicular Tech. Conf., 1988, pp. 543–547.

Motorola, "DYNA T–A–C 6000X Universal Mobile Telephone", 1984.

IEEE Communications Magazine, "Trends in Cellular and Cordless Communications", D.J. Goodman, Jun. 1991, pp. 31–40.

Ericsson Review, "Introduction of Digital Cellular Systems in North America", F. Lindell and K. Raith, No. 2, 1990, vol. 67.

Global News, "Hughes Network Systems Jumps into the Cellular Arena with GM Backing", Feb. 1991, pp. 15–16.

*Primary Examiner*—Wellington Chin
*Assistant Examiner*—William Luther
*Attorney, Agent, or Firm*—Burns, Doane, Swecker & Mathis, L.L.P.

[57] ABSTRACT

A digital system accommodates analog communications, thus avoiding the need for separate subsystems each dedicated to either analog or digital communications. The system includes a receive circuit for converting received signals into an intermediate frequency, a transmit circuit for modulating and transmitting signals and signal processors for processing the intermediate frequency signals and the signals to be transmitted, wherein the signals can be processed into digital or analog format using substantially the same circuitry.

12 Claims, 17 Drawing Sheets

U.S. PATENT DOCUMENTS

| | | | |
|---|---|---|---|
| 5,020,076 | 5/1991 | Cahill et al. | 375/216 |
| 5,020,093 | 5/1991 | Pireh | 379/59 |
| 5,029,233 | 7/1991 | Metroka | 455/11 |
| 5,048,059 | 9/1991 | Dent | 375/340 |
| 5,079,550 | 1/1992 | Sooch et al. | 341/143 |
| 5,084,669 | 1/1992 | Dent | 324/76.82 |
| 5,119,397 | 6/1992 | Dahlin et al. | 375/216 |
| 5,124,672 | 6/1992 | Kuisma | 332/103 |
| 5,124,703 | 6/1992 | Kaneaki et al. | 341/77 |
| 5,150,362 | 9/1992 | Akerberg | 370/331 |
| 5,163,159 | 11/1992 | Rich et al. | 455/142 |
| 5,189,593 | 2/1993 | Ooi | 455/195.1 |
| 5,220,275 | 6/1993 | Holmqvist | 324/76.82 |
| 5,251,232 | 10/1993 | Nonami | 375/216 |
| 5,276,914 | 1/1994 | Ishizuka et al. | 455/83 |
| 5,319,675 | 6/1994 | Osaka | 375/295 |
| 5,521,559 | 5/1996 | Ichihara | 332/117 |
| 5,610,940 | 3/1997 | Durrant et al. | 375/208 |

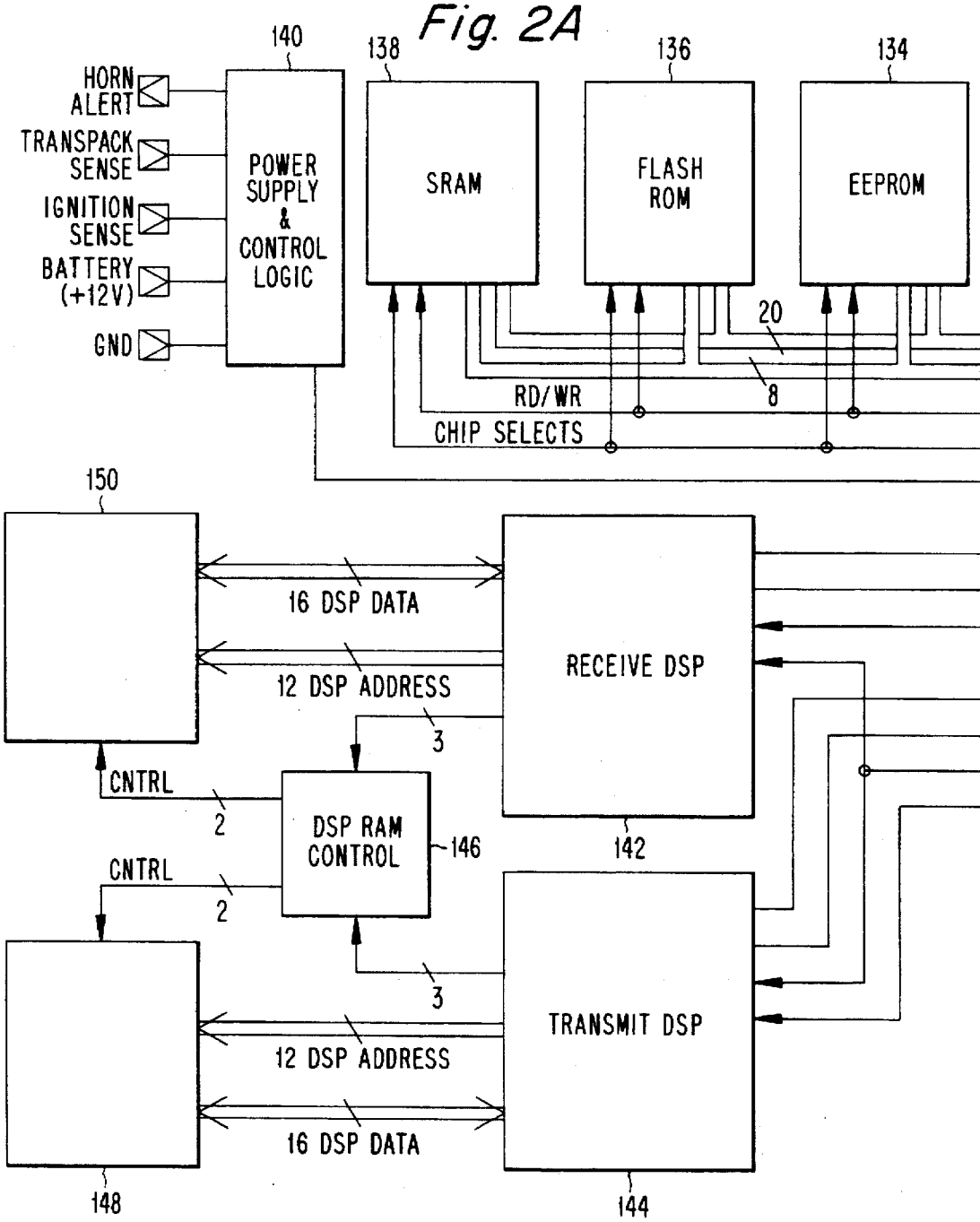

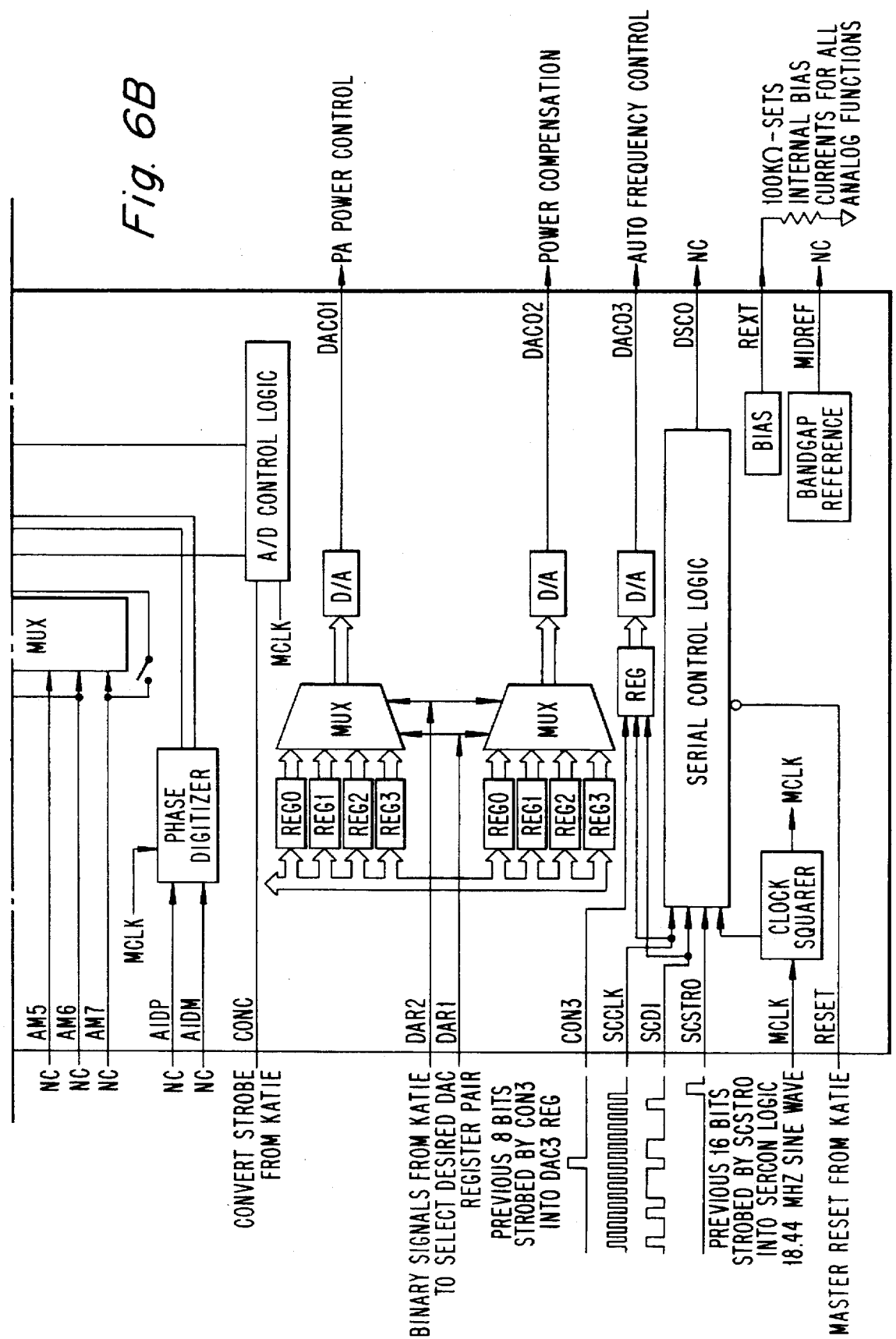

MULTI-MODE SIGNAL PROCESSING

BACKGROUND OF THE INVENTION

1. Field of the Invention

The present invention is directed to a multi-mode radio communication system capable of digital and analog communications, and more particularly, to a TDMA dual-mode digital cellular telephone wherein analog communications are provided by digital technology.

2. Description of Related Art

As the density of two way radio communication increases, there is an increasing pressure to service more telephones in a given geographic region. The pressure is exacerbated because of the limited number of frequencies a geographic area is allotted for a given use.

The existing AMPS cellular system in the United States uses analog-FM for voice transmission. Because of the demand for significant increases in traffic capacity over the same frequency spectrum currently used in analog systems, for lower cost operation and additional mobile telephone features, such as battery-saving capabilities, a transition is being made from analog to digital communications in cellular telephone systems.

Time Division Multiple Access (TDMA) is the digital format chosen for the new generation of cellular phones.

Digital TDMA offers some very important advantages over the analogy-FM "AMPS" system. Among these are a 3-to-1 call to channel ratio, better interference rejection, and much higher degree of speech security. Clearly the 3-to-1 call ratio is of much interest to the Metropolitan Statistical Area (MSA) system operators with traffic congestion (system busy) problems.

A cellular phone system which utilizes both analog and digital cellular telephone standards has been contemplated. The Electronics Industries Association (EIA) and the Telecommunications Industries Association (TIA), which establish minimal standards for utilizing the public airways and telephone lines, have outlined the operating format for a dual-mode TDMA/Analog cellular phone in the EIA/TIA document IS-54. A dual-mode system would tend to bridge the transition time for switching over from analog systems to digital systems as well as permit the continued existence of analog only systems in Rural Statistical Areas (RSAs), for instance.

U.S. Pat. No. 5,119,397 to Dahlin et al., herein incorporated by reference, discloses a combined analog and digital cellular telephone system which permits analog, digital and dual analog/digital mobile stations to coexist in a flexible manner. That patent discloses the parallel introduction of a separate digital system while leaving the fixed analog system unmodified. A secondary set of control channels are added so that, where a separate digital system does exist, the mobile stations with digital capabilities will scan and read the secondary set of control channels. If the separate system does not exist, the mobile stations with dual analog/digital capabilities will return to scan the primary set of control channels, which control analog communications. That patent does not address details of a dual-mode analog/digital cellular phone.

U.S. patent application Ser. No. 07/751,763 filed Aug. 29, 1991 for Dahlin et al., herein incorporated by reference, discloses a cellular radio telephone communications system for multi-mode mobile radio telephone stations capable of analog only, digital only and dual-mode traffic channel capabilities. The multi-mode station includes a digital part and a separate analog part where incoming signals are switched to, and outgoing signals are switched from, the appropriate part.

U.S. Pat. No. 4,857,915 to Andros et al. discloses a paging system which is compatible with transmissions from analog and digital paging transmitters for receiving short digital or analog messages. While the Andros et al. patent describes reception of pages from either analog or digital transmitters, it does not disclose a cellular telephone system in which a mobile telephone may select either a digital or an analog control channel.

SUMMARY OF THE INVENTION

The present invention re-uses the digital processing circuit of a mobile telephone unit to achieve analog communications, thus avoiding the need for a substantial number of duplicate parts. The mobile set is as compact as a normal cellular phone, and easily and quickly installed. Furthermore, the dual-mode cellular phone allows a user to access either an analog cell base station or a digital cell base station and can result in the user being given preferential treatment by a dual-mode cell base station.

Due to the more efficient use of the limited radio spectrum, digital channels will be used first when digital capable mobiles are requesting service. In an area where system "busies" are chronic, the dual-mode phones will have the highest probability of completing a call.

These features and advantages are gained by a dual-mode signal processing system including a receive circuit for converting analog or digitally modulated received signals into an intermediate digital form for processing, a transmit circuit for converting analog or digital signals to an intermediate digital form and then modulating a transmit signal, and signal processors for processing the intermediate digital signals and the signals to be transmitted, wherein the signals can be processed into digital or analog format using substantially the same circuitry, thus avoiding the need for a substantial number of duplicate parts.

BRIEF DESCRIPTION OF THE DRAWINGS

The invention will now be described in detail with reference to the accompanying drawings in which.

DETAILED DESCRIPTION OF THE PREFERRED EMBODIMENTS

Figure 1A:
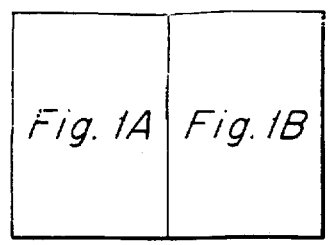
FIG. 1 (A and B) is a schematic of RF circuitry in accordance with the present invention.

An embodiment of the present invention includes digital cellular phones which are also analog compatible; a dual-mode phone. The analog section functions identically to previous models of analog phones though it re-uses many of the components developed for the digital portion. This enables the production of a dual-mode transceiver with the same physical dimensions as in previous analog-only models. Thus, a user who already has a built-in, analog-only model can be upgraded to digital capability in a matter of minutes without the cost of a new installation.

In an effort to minimize cost and power consumption, as much of the radio hardware is used in both modes as is possible. A software change and some hardware operating mode changes are all that is needed to switch from analog to digital and back in the preferred embodiment.

The main differences between the two modes are the rate at which the transmit and receive interfaces run and the type of software running in the DSPs (Digital Signal Processors).

Each time a mode change is required, the microprocessor commands the hardware interfaces to change rates and downloads a completely different set of software to the DSPs. One DSP 144 (FIG. 2) performs all transmit functions, and a second DSP 142 performs all receive functions.

In that sense, there are 5 completely different sets of software in the Read Only (FLASH-TYPE) Memory 136. One set for the microprocessor and four sets for the DSPs (analog transmit, analog receive, digital transmit, and digital receive). The DSPs are in one implementation RAM-based, meaning that they store all of their executable software in RAM. The four sets of DSP software are retrieved from the FLASH EPROM 136 and downloaded to each DSP as necessary. The analog software fits entirely in each DSP's on-chip RAM. Depending on the amount of RAM available, it may be necessary to employ additional, external RAM chips 148 and 150 to accommodate the digital-mode programs. An alternative embodiment includes ROM-based DSPs which may have permanently programmed software, that can contain analog and digital mode software without supplementary external memory.

In analog mode, the mobile occupies two frequencies; one for transmit and one for receive. In digital mode, this would not conventionally have been necessary, since the mobile could be receiving at a different time than that of its transmit slot. However, since the mobile according to the present invention is to be compatible with the current analog systems, it does in fact use a separate frequency for digital receive and transmit. The system called "TIME DUPLEX" is used such that it is not transmitting while receiving. The time-duplex order is Transmit-Receive-Scan-Transmit-Receive-Scan in the 6 time slots described in below. Since the exact same operation is done in both time slots (1 and 4, 2 and 5, or 3 and 6), the mobile refers to a frame as only 3 time slots (20 ms). It is performed twice to produce the 6 slots (40 ms) as described below in order to allow for future mobiles that will transmit only in slot 1 and receive in slot 2, by compressing further the amount of information needed to represent speech, thus achieving a further advantage.

The Hardware

Figure 1A:
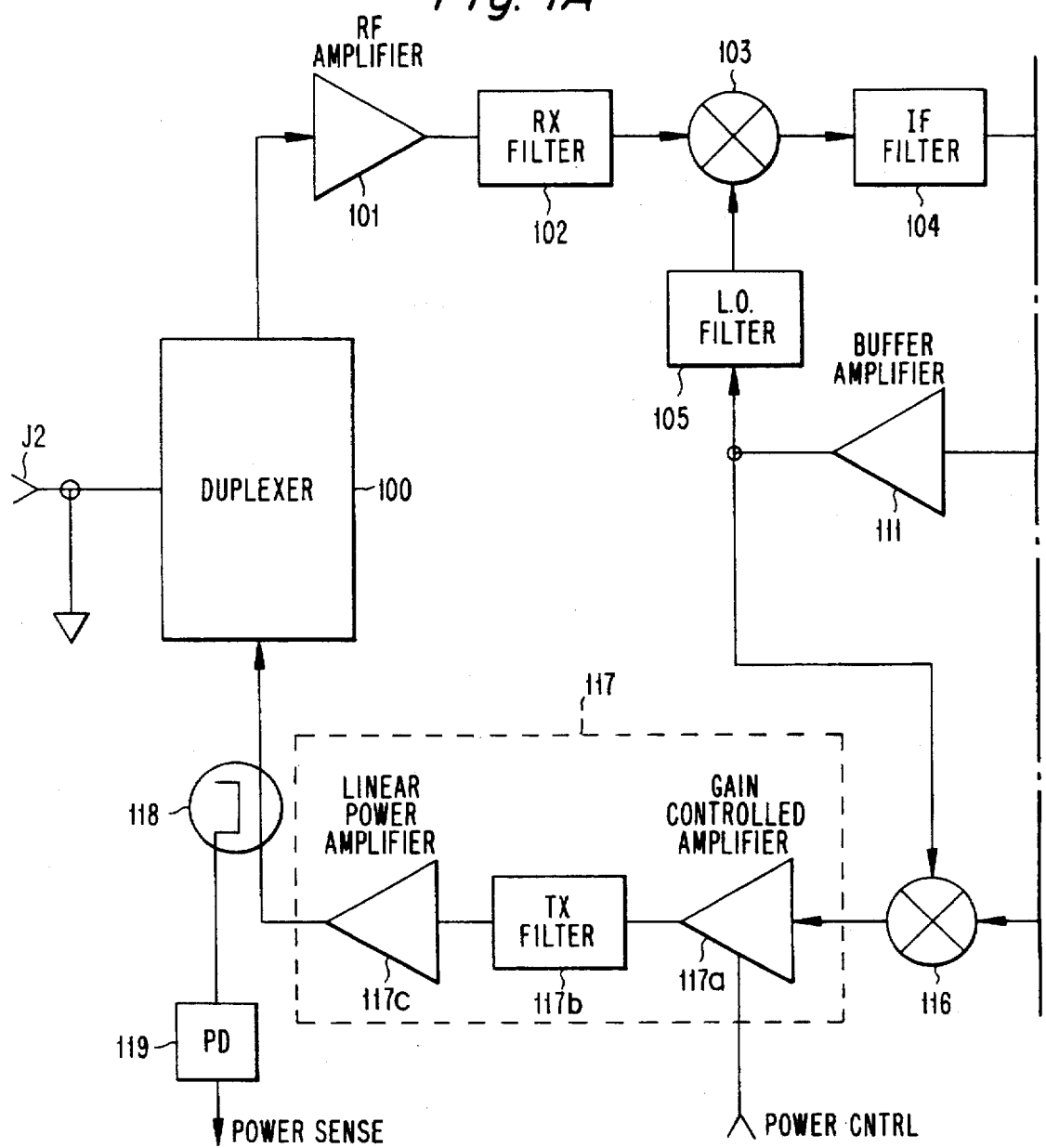
Figure 1B:
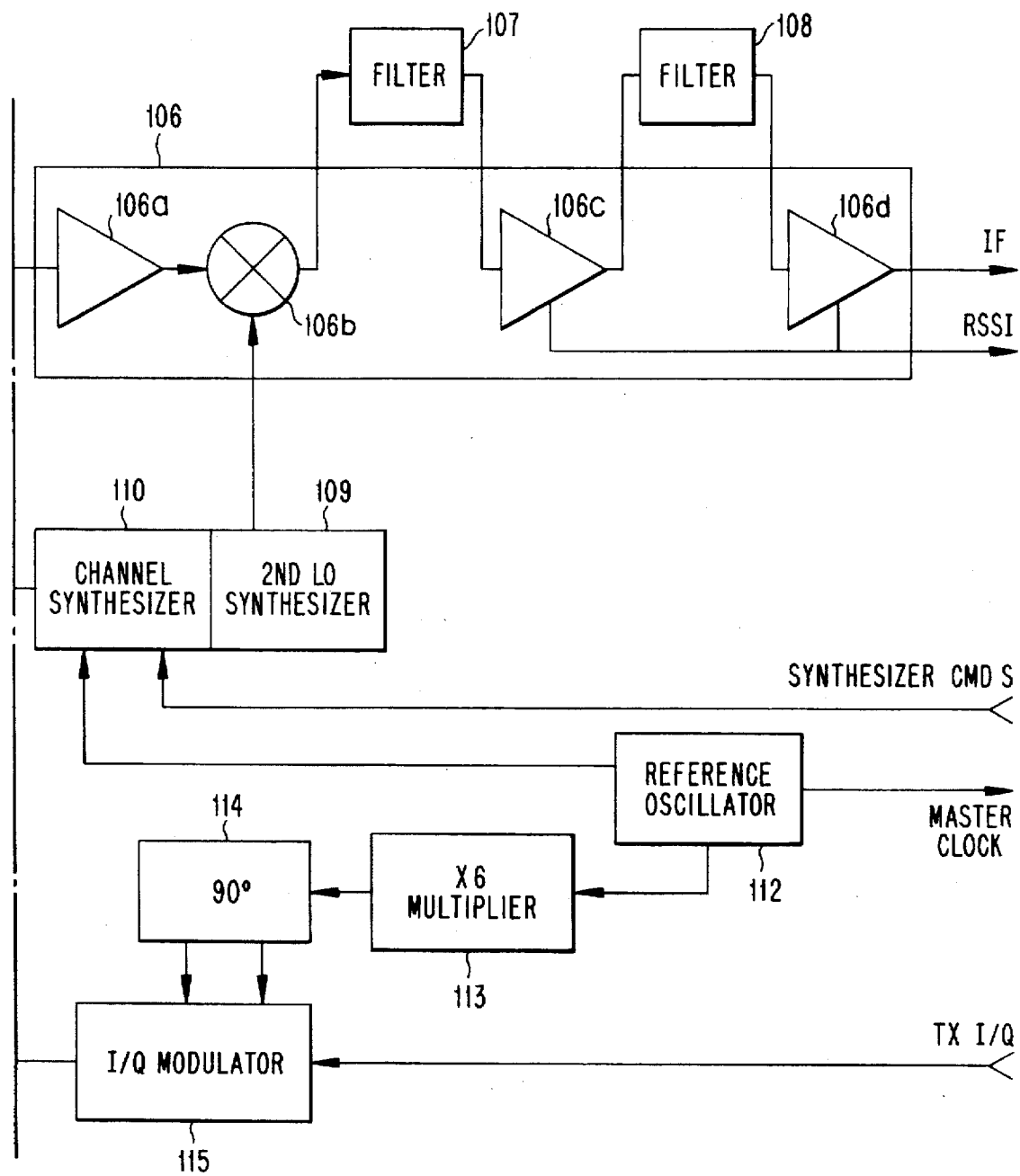

With reference to FIG. 1, a duplexer filter 100 allows full duplex operation in analog mode by separating the transmit and receive signal paths. A common antenna connects to a female connector J2, located on the side of the radio. This connector J2 protrudes through the aluminum casting and connects directly to the printed circuit board. The RF input to the duplexer 100 is from a transmit power amplifier 117. The RF output is from the duplexer 100 to a first RF amplifier 101 of the receiver circuit.

The transmit circuit includes a multiplier 113, an I/Q modulator 115, a mixer 116, a channel synthesizer 110, a power control circuit (not shown), and a power amplifier 117. It operates over a frequency range of 824.04 MHz to 848.97 MHz in the preferred embodiment. Modulation is accomplished at the I/Q modulator 115, whose carrier frequency is supplied by the output, e.g., 116.64 MHz, of the multiplier 113. The transmit frequency is generated by mixing output of the channel synthesizer 110, as modified by a buffer amplifier 111, and the output of the I/Q modulator 115. It is then amplified, through a gain controlled stage 117a and filtered at TX filter 117b before being coupled into the linear power amplifier 117c.

The transmitter intermediate frequency TX IF of 116.64 MHz is generated by multiplying, via the multiplier 113, a reference signal from a reference signal generator or oscillator 112 by a factor of 6.

The transmit power control circuit (not shown) may employ a closed-loop RF power regulation circuit. This circuit consists of a directional coupler 118, a diode power detector 119 with a temperature compensator diode, and a microcontroller 120 together with D/A and A/D circuits in a custom ASIC (Application Specific Integrated Circuit) 124.

The directional coupler 118 provides a sample of the RF power amplifier 117c output to the diode power detector 119. The DC output of this detector 119 is temperature compensated by a diode. The output of the detector circuit is a DC voltage related to the carrier power level, and independent of the ambient temperature.

The DC voltage from the directional coupler 118 is fed to an A/D circuit in the ASIC 124, which digitizes the analog voltage and sends it to the microcontroller 120 where it may be digitally averaged before comparison to one of a number of desired reference levels and the power amplifier 117c output adjusted to bring the directional coupler 118 voltage to the selected average level.

The carrier power may be adjusted by varying the control voltage applied to an AGC amplifier 117a, through a D/A circuit in the custom ASIC 124. This allows the RF input drive level to the linear power amplifier 117c to be varied over the desired power control range while maintaining linear operation of the transmitter chain. The RF power output from the linear amplifier 117c may be approximately 5.5 watts, corresponding to 3 watts at the antenna connector J2. In the case of a hand portable dual-mode phone, the power output level is somewhat lower at around 0.6 watts.

The receive circuit operates over the frequency range of 869.04 MHz to 893.97 MHz, and may be a dual conversion superheterodyne receiver with a 71.04 MHz first intermediate frequency (IF), and a 600 kHz second IF. The channel synthesizer 110 provides the high side, first local oscillator frequency injection to the receive circuitry. The channel synthesizer 110 tunes the range of 940.68 MHz to 965.61 MHz in 30 kHz steps.

The receiver circuitry includes a RF amplifier 101, a RF bandpass filter 102, a first mixer 103, a 71.04 MHz crystal filter 104, a second mixer/amplifier/oscillator circuit 106, and two second IF filters 107, 108.

The RF input signal from the antenna enters the receiver through the duplexer 100. The signal is supplied to the RF amplifier 101, where it is amplified by approximately 16 dB. The signal is then applied to the input of the receiver filter 102. The duplexer 100 and the filter 102 provide first image rejection, limits conduction of the channel synthesizer frequency to the antenna port, and protects the receiver from being over-driven by the transmit signal.

The output of the receiver filter 102 is supplied to the first mixer 103 where it is mixed with the signal from the channel synthesizer 110 supplied through a buffer amplifier 111 and filter 105. The mixer output is applied to the first IF filter 104. The filter output is applied to a mixer/amplifier/ oscillator circuit 106 where it is downconverted at block 106b to 600 kHz. After the downconversion the signal is filtered by two filters 107 and 108 and amplified by multi-stage amplifiers 106c and 106d. The 600 kHz signal has a time varying phase and a time varying amplitude. Indeed it can be shown that any radio signal whatsoever can be represented by a time varying phase and time varying amplitude.

Alternatively, the radio signal can be regarded as a complex vector whose real and imaginary parts are time varying. To digitize the 600 kHz IF signal for subsequent numerical processing, it may either be split into its real and imaginary components which are then separately digitized (so called I,Q method) or a signal related to the amplitude and a signal containing the phase information may be digitized (so called LOG POLAR method). The latter is used in the preferred embodiment. Consequently, the IF amplifier stages 106c, 106d generate a signal proportional to the logarithm of the amplitude called RSSI (Radio Signal Strength Indication) and a hard limited 600 kHz IF signal containing the phase information, both then being fed to suitably adapted A-to-D convertors for digitizing.

The LOG POLAR method of extracting complex vector values from a radio signal is described in U.S. Pat. No. 5,048,059, which is hereby incorporated by reference. The LOG POLAR method requires a means of digitizing the phase angle of an RF signal. The preferred method is disclosed in U.S. patent application Ser. No. 07/736,430 now U.S. Pat. No. 5,220,275. Another suitable method is described in U.S. Pat. No. 5,084,669 and both are incorporated hereby by reference.

Figure 2B:
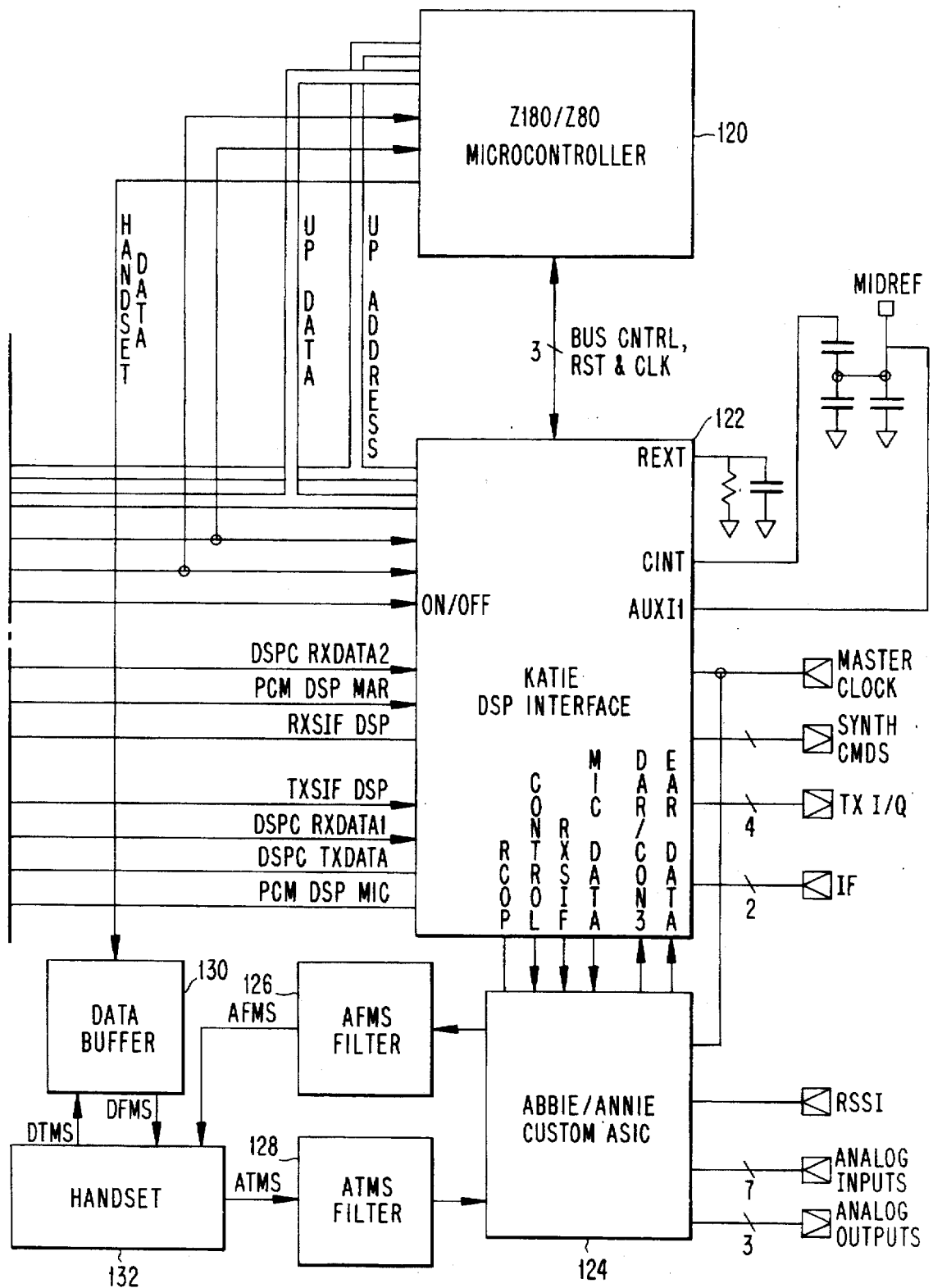
FIG. 2 (A and B) is a schematic of the digital circuitry in accordance with the present invention.

There can be three types of memory used in the dual-mode radios of the present invention, shown in FIG. 2. A 256 k×8 (256 kilobit), flash programmable ROM 136 is used to hold the microprocessor operating code, and the four sets of operating code to be retrieved and downloaded to the DSPs 142, 144 at the appropriate time. Next there is an 8 k×8 Electrically Erasable Programmable ROM (EEPROM) 134 which is used for parameters which may be updated by the user and saved during a power-down, e.g., volume level, name and number storage, etc. Finally, an 8k×8, static RAM 138 is needed by the microprocessor for use as a scratch pad, for interrupt context saves, etc.

There is a reserved area in both the flash memory 136 and the EEPROM memory 134 for a "boot" code. This code will be executed if and when the radio is to be uploaded with completely new software.

There are two DSPs (digital signal processors) in the dual-mode radio. One DSP 144 performs all transmit functions, and the other DSP 142 performs all receive functions. Each DSP is fed by a separate dedicated clock from KATIE DSP interface 122. Each of these clocks is 19.44 MHz. The DSPs 142, 144 execute one instruction per external clock cycle, so they can execute at 19.44 MHz. The clock frequency chosen to maximize commonality of the parts between analog and digital modes should be a multiple of 8 kHz, 30 kHz and 48.6 kHz. The LCM is 9.72 MHz so the optimum clock frequencies for the present invention are preferably multiples of 9.72 MHz. 19.44 MHz is the chosen multiple in the preferred embodiment of the present invention.

Each DSP 142, 144 has two serial ports. One bi-directional port on each is used by the interface (microprocessor 120). The transmit DSP 144 splits the other port between microphone PCM data PCM DSPMIC and RF transmit data DSPC RXDATA1, and the receive DSP 142 splits its other port between PCM speaker data PCM DSP EAR and RF receive data DSPC RXDATA2.

Each DSP 142, 144 is RAM based, with a 2 k word boot ROM. Both DSPs 142, 144 are downloaded on power up with analog function software for operation on a control channel as explained in more detail below. If an analog voice channel is assigned, the code is already in the DSPs 142, 144 to do the job. If a digital channel is assigned, both DSPs 142, 144 are completely downloaded with new software for digital mode operation from RAMs 148, 150, which are controlled by DSP RAM control 146. At termination of the digital call or a handoff to an analog cell, the DSPs 142, 144 are again downloaded with analog mode software. Software downloads to the DSPs occur via the host interface and at the high speed rate (4.86 MHz).

The heart of the mobile is the ASIC chip 122 code named "KATIE" (FIG. 2), which keeps all of the complicated timing required for digital mode operation. It is based on a 20 ms frame. Certain events occur during each of these frames, e.g., transmitter on, transmitter off, receiver on, etc. This timing, e.g., the timing of turning on and off, is governed by a timing generator contained in the KATIE chip producing strobes to different parts of the hardware.

All timing and frequency information is derived from the base station's transmit signal in a well known manner. The receive DSP 142 derives timing and frequency errors for the incoming signal, and reports them to the microprocessor 120. The microprocessor 120 then updates the timing strobe generator and alters the TCXO (Temperature Compensated Crystal Oscillator) reference by the appropriate amount, forming a numerically implemented second-order frequency control loop.

Nearly all radio functions pass through or in some way are controlled by the KATIE ASIC 122. One very important function of the KATIE chip 122 is to take the low-level reference oscillator output and create a TTL (Transisor-Transistor-Logic) square-wave clock and several "divided-down" clocks for distribution to other digital devices.

A full specification document (#10262-RCP 101 637/C) is available which describes in detail each functional block of the KATIE ASIC 122.

An alternative version of the KATIE ASIC, the KATARINA chip, includes a microprocessor Z80 and a memory management unit for increasing addressable memory beyond 64 k bytes, as well as sleep mode, power-down circuits for battery conservation. The KATIE/KATARINA chip includes functions which are used primarily in a hand portable telephone as well as functions used by a mobile (car) phone. These functions include keypad scan interface, I²C (a Philips inter-chip communications protocol) display driver, alert tone generator, and some miscellaneous I/O functions.

Figure 4:
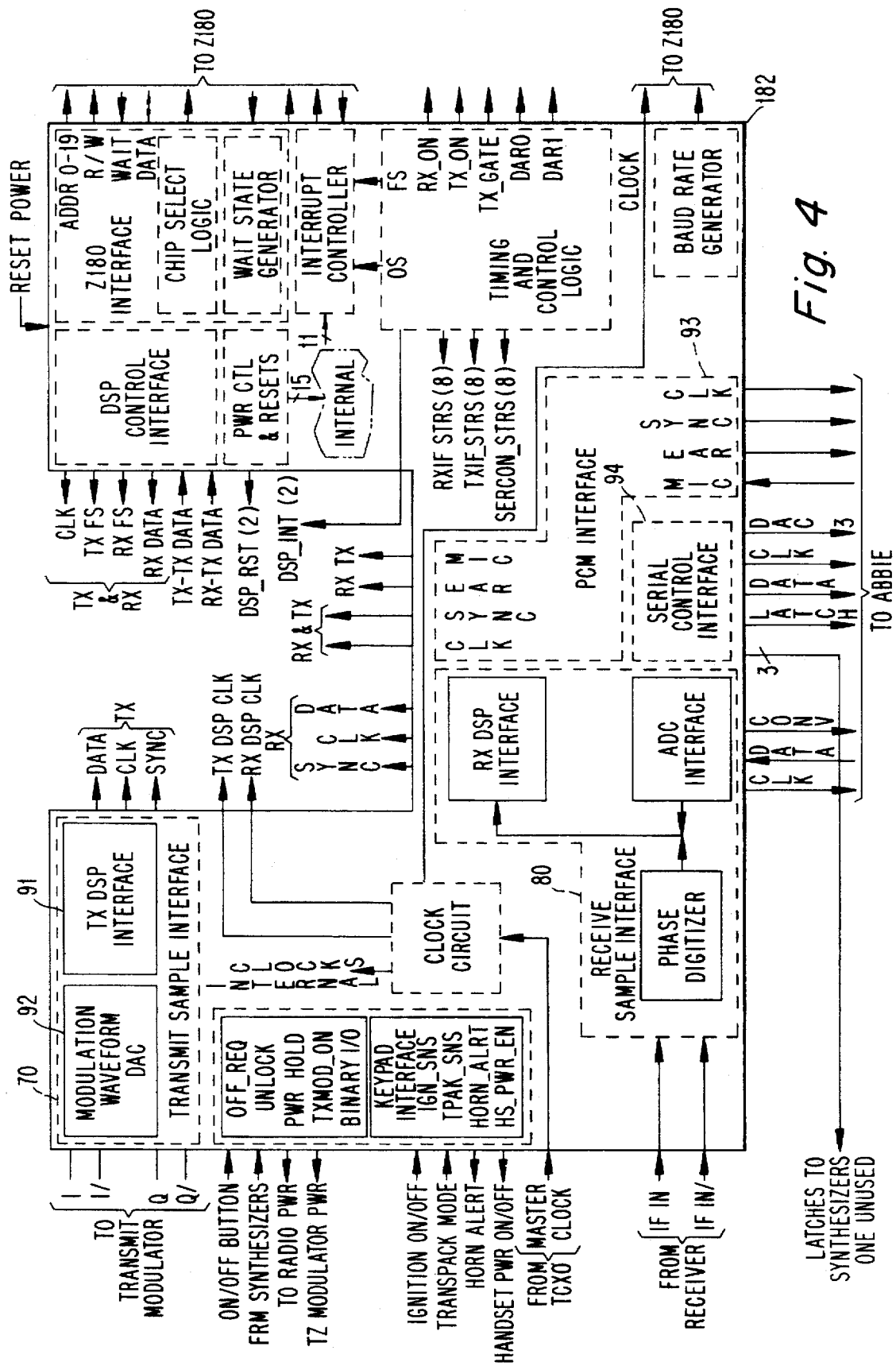
FIG. 4 is a functional block diagram of a first custom integrated circuit or ASIC code-named KATIE.
Figure 6A:
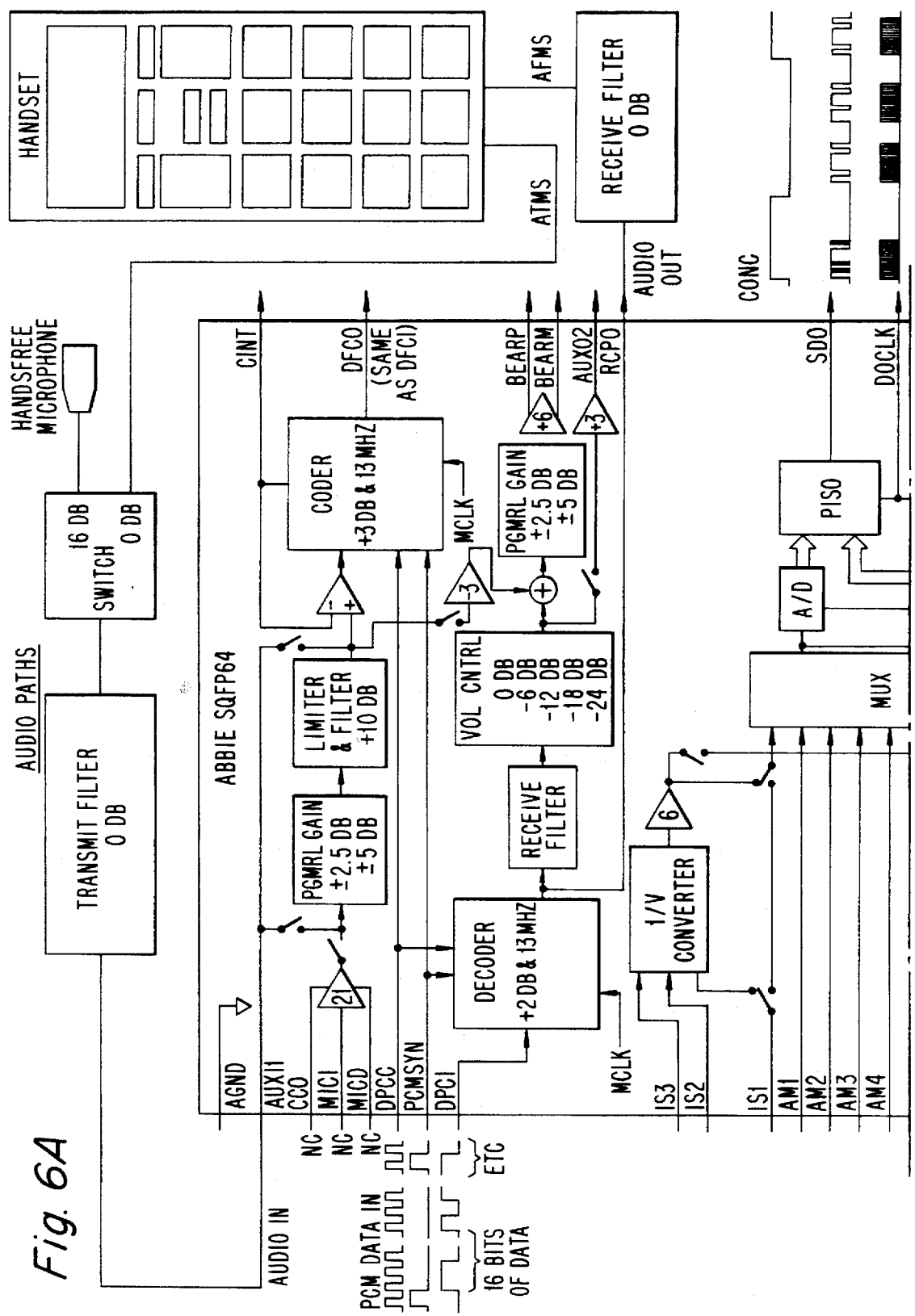
FIG. 6 is a diagram of a second integrated circuit code-named ABBIE and associated audio paths.

FIG. 4 is a functional block diagram of the KATIE ASIC and showing the major interface types of signal present during different modes of operation. FIG. 6 is a diagram of the "ABBIE" chip and audio paths.

The voice codec (coder/decoder) of the ABBIE chip converts analog voice signals to digital signals and visa-versa. The digital voice signals are, according to the invention, even used to implement an AMPS-compatible analog-FM transmission/reception mode. The voice codec is advantageously constructed in the preferred embodiment using companded delta modulation coding for digitization of analog speech. Companded delta-modulation is based not on noise shaping but on companding (COMpressing the volume of a signal at one point and restoring it through exPANsion at another point.

The most well-known companded delta-modulation principle is called Continuously Variable-Slope Delta or CVSD modulation, and has been employed in applications where low bitrate delta-modulation was the final coding form in which the speech was desired for transmission or storage. Utilizing CVSD as the basis for an oversampled binary A-to-D convertor, requiring decimation and downsampling, was previously thought to be complicated by the non-linearity inherent in companding. Thus it is not possible, as in uncompanded delta modulation, to simply filter the bit stream. This problem is solved in the present invention by the used of a digital syllabic filter and use of the digital value therefrom in the decimation process.

Figure 12:
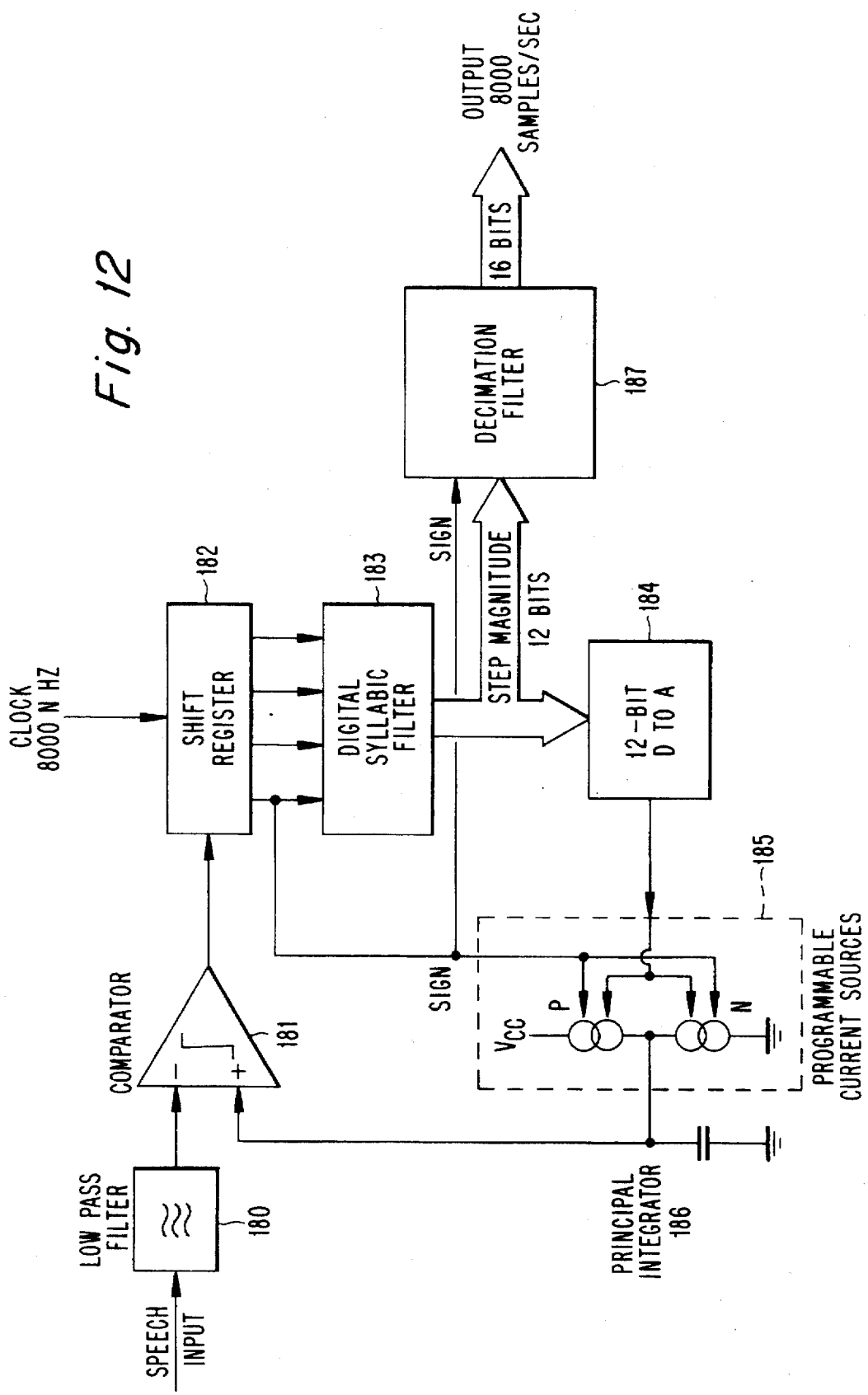
FIG. 12 is a diagram of a speech encoder used in the preferred embodiment of the invention.

The speech encoder will be described with reference to FIG. 12. In FIG. 12, the input speech is low-pass filtered in filter 180 only to the extent needed to prevent aliasing with the delta modulation bitrate. In the preferred implementation, the delta-modulation bitrate is either 200 k bits/sec. or 240 k bits/sec., the corresponding oversampling factor N being 25 or 30.

The filtered speech is applied to one input of a comparator 181 with the principal integrator 186 output applied to the second input. In the preferred implementation, the principal integrator is formed by capacitor connected from the output of programmable current source 185 to ground. Programmable current source 185 is able to generate either a pull-up current from a current source made with P-type transistors, or a pull-down current from a current source made with N-type transistors, such that the voltage on the capacitor may be incremented or decremented to follow the speech signal. The sign of the change, up or down, is determined as usual by the comparator high/low decision as registered on every clock tick in the first flip-flop stage of shift register 182. This controls whether the P or N type current source in 185 is enabled.

Shift register 182 also delays the up/down decision in three further stages, such that four consecutive decisions are available to the digital syllabic filter 183. Depending on the pattern of the four decisions, the syllabic filter either increments a 12-bit value by one or two, decrements it by one or two, or leaves. The resulting 12 bit value represents the stepsize that shall be used for incrementing or decrementing the principal integrator. This 12-bit digital representation of the stepsize is used to program the current level of current sources 185 via a 12-bit D-to-A convertor 184. In the preferred implementation, the 12-bit D-to-A convertor is formed by splitting the 12-bit word into three 4-bit nibbles, which are used to control the current in three, parallel current sources having current ratios of 1:16:256. The current from each is controlled by using its associated 4-bit control nibble to control the width of its current pulse to one of 16 values. The principal integrator is thus caused to follow the speech signal in a series of not necessarily equal up or down steps. The step magnitude is given by the 12-bit output from the syllabic filter 183 while the sign is given by the comparator decision. The 13-bit combination is thus a sign-magnitude representation of the series of steps, which, when integrated digitally in decimation filter 187, will create a numerical facsimile of the analog voltage on integrator capacitor 186.

The decimation filter 187 commences therefore by accumulating the sign-magnitude step representation in a digital accumulator. The accumulator has a fraction $1/512$th of its own value subtracted from itself at every iteration to make it a leaky integrator, necessary to ensure that it does not drift to one extreme or another. The fraction $1/512$th, corresponds to a high-pass filter having a corner frequency around 64 Hz.

The syllabic filter's first operation is thus expressed mathematically as:

$$Ii=1\tfrac{1}{512}.Ii-l+Di$$

where Di is the signed stepsize.
Equating the factor $1\tfrac{1}{512}$ with an exponential decay factor per clock tick period T $$EXP-wT=1\tfrac{1}{512},$$

results in $wT=1/512$, so for $T=1/200000$ w is just less than 400 radians/sec corresponding to 64 Hz.

The second stage of the decimation filter is to compute the sum of the integrated values over N values. The sum is then output every 8000 Hz period.

It can be shown that the frequency response of the above decimation filter corresponds to a sin x/x squared function, where $$x=Pi.f/8000=w/16000$$

f being the frequency in Hz and w the same in radians/sec. This causes an attenuation of 2.75 dB at the highest speech frequency of 3.4KHz. To compensate for this, the accumulator of the final stage is not reset to zero prior to the next addition of N values, but to minus one eighth of the previous result. This results in emphasizing the higher speech frequencies and thus compensating for the sinx/x roll-off.

The speech decoder is the counterpart of the speech encoder. Its function is to access a stream of binary coded speech samples at, for example the standard rate of 8000 samples per second, and to convert them to a corresponding analog speech waveform. In line with the alternate operation modes provided by the encoder, the invention allows the decoder to operate in corresponding alternate modes.

The prior art for D-to-A conversion is analogous to that for analog-to-digital conversion, comprising two principal methods:

A conventional D-to-A convertor based on an accurate resistor network e.g., R-2R ladder, or using oversampled delta- or delta-sigma modulation. A third prior art method using pulse width modulation is also known. When 13-bit accuracy or more is needed, the technique requiring accurate resistor networks may not be suitable for integration in a larger silicon chip because of conflicting process requirements. The technique of oversampled non-companded delta-modulation has the disadvantage that the decimation filters have to operate at a high computation rate, consuming more power. Therefore the preferred embodiment of the present invention makes use of companded delta-modulation allowing the bit rate to be substantially reduced while maintaining a given voice quality.

Figure 13:
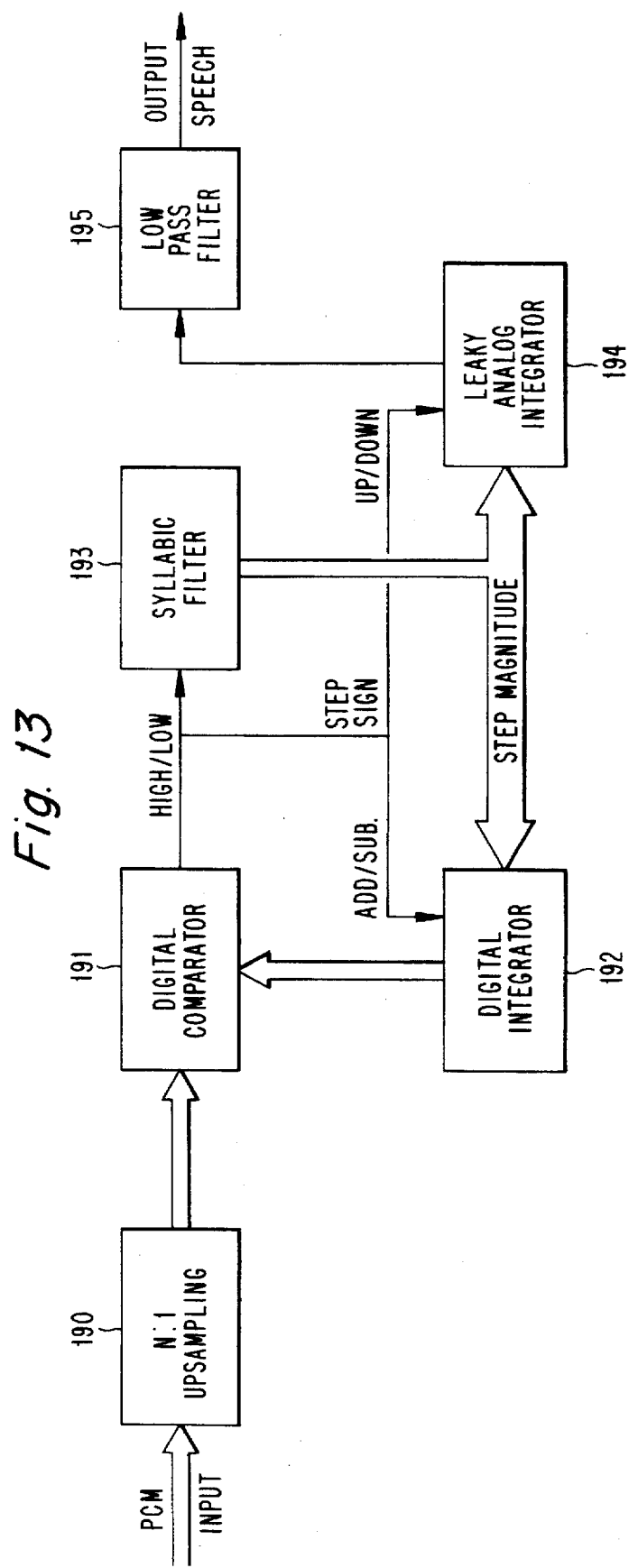
FIG. 13 is a diagram of digital-to-analog converter used in a preferred embodiment of the present invention.

A D-to-A convertor according to the invention is shown in FIG. 13. The input binary-coded speech samples PCM at the standard 8000 s/s rate are first upsampled by a factor N to the desired delta-modulation rate. The technique used in upsampler 190 is linear interpolation between successive input samples. There is a trade-off between complexity in the interpolation technique used for upsampling and the complexity of analog filter 195 needed to suppress components higher than half the original 8000 Hz sample rate. Higher order upsampling would allow low-pass filter 195 to be of a more relaxed design, but in the preferred embodiment where the output speech waveform is intended to drive an earphone, it was found that adequate performance was obtained using linear interpolation.

The upsampled values are compared in digital comparator 191 with the value in a digital integrator 192, producing a "higher than" or "lower than" decision. These are fed into a digital syllabic filter 193, generating a step magnitude with which the digital integrator will be incremented or decremented according to the sign of the comparison.

The digital integrator value is thus caused to follow the sequence of upsampled input values in a series of up/down steps.

The same step magnitude and sign are fed also to an analog integrator 194. This reproduces in analog form the same waveform as described numerically by the sequence of digital integrator values. After low-pass filtering in filter 195 to remove digital noise components higher than the maximum speech frequency of 3.4 KHz, the analog speech waveform is available, for example to drive a telephone earpiece.

In the case of the encoder part of the invention, the analog integrator was in the feedback loop to the comparator, preventing drift, while the digital integrator operated open loop, requiring a leakage component to prevent drift. In the decoder case, the digital integrator operates within the loop so does not need to be leaky; the analog integrator however operates open loop so requires leakage to control drift. The leaky analog integrator is formed by use of exactly the same programmable current sources and pulse width controller. The difference is that, to introduce leakage, the integrator capacitor is shunted with a resistor. This causes a reduction in gain at lower frequencies relative to a perfect integrator, but providing the RC corner frequency is chosen well below the 300 Hz minimum speech frequency, say 60Hz, no problem results.

As in the case of the encoder, the current sources can be of a simplified design if they operate into a virtual ground, that is at constant output voltage. On the other hand an alternate arrangement of just feeding the current sources into a capacitor to ground can be employed.

The ABBIE chip includes other A-to-D functions such as digitizing the RSSI signal to implement the LOGPOLAR digitzing method, and D-to-A functions such as producing a voltage under microprocessor control for adjusting the frequency of the TCXO to match a frequency received from a base station (Automatic Frequency Control; AFC).

The pin labelled CINT on the ABBIE chip is for the connection of the principal integrator capacitor for the delta-modulation audio codecs. An analog voltage representative of the speech waveform is created across CINT capacitor by means of a bi-directional charge pump either pump charge in or out to increase to decrease the voltage in such a way that it follows the desired speech signal. This principle is more fully described above.

The pin labelled CINT on the ABBIE chip is for the connection of the principal integrator capacitor for the delta-modulation audio codes. An analog voltage representative of the speech waveform is created across the CINT capacitor by means of a bi-directional charge pump either pumping charge in or out to increase to decrease the voltage in such a way that it follows the desired speech signal. The ABBIE chip includes a serial control section that permits the microprocessor 120, via the KATIE/KATARINA chip 122, to tell ABBIE chip 124 the clock frequency used in this application (i.e., 19.44 MHz), set the internal configuration of the A-to-D converter, multiplexer and audio paths, and to power-down any unused parts, at particular times such as standby, put the proper values into the D-to-A registers (DAR) for D-to-A converter (DAC) channels 1 and 2 and to transfer the digital value to be used by DAC channel 3.

The voice codes of the ABBIE chip 124 operates to output or accept 13 bit (at least) linear PCM representations of speech signals. The chip also contains related filters and amplifiers to, for the transmit path, convert the audio signal from the handset/handsfree microphone into the 13-bit digital PCM as needed by the transmit digital signal processor 144 and, for the receive path, convert the PCM generated by the receive digital signal processor 142 into the audio signal to the handset. The PCM data in and out is transmitted in bit-serial form between the ABBIE and KATIE/KATARINA chip.

The ABBIE chip 124 includes a 5 volt-in to 8-bit-out A-to-D converter with 8 channel multiplexer in which channel 0 is used to digitize the RSSI signal. The RSSI signal is processed by the microprocessor while scanning frequency channels upon power-up in order to locate the base station whose analog control channel is received the strongest. Information may then be read from the analog control channel giving the frequencies of any available digital control channels. The digitized RSSI signal is used along with digitized phase information to construct complex numbers representing the radio signal for processing. Channel 2 is used to measure battery voltage. Channel 3 measures the temperature in the radio for temperature compensation. Channel 4 measures transmit PA power of power amplifier 117c. Channels 1, and 5 through 7 are spare and are tied to +5 volts. The digital value generated by the A-to-D is transmitted serially to the KATIE/KATARINA chip 122.

The ABBIE chip 124 also includes three 8-bit-in to 5-volt-out D-to-A converters of which one is used to control the transmitter power, another is used for temperature compensation, and the third controls the 19.44 MHz TCVCXO (Temperature Compensated Voltage Controlled Crystal Oscillator). The digital values for the voltages generated on channels 1 and 2 are kept in four pairs of registers (Reg 0–5 Reg 3) internal to ABBIE chip 124. These values are written by the microprocessor 120, via the serial control interface. A separate pair of pins is used to signal which of the four pairs of register values is sent to the D-to-A converter channels 1 and 2. The digital value for channel 3 is sent via the serial control interface. A separate strobe tells the ABBIE chip 124 to use the last 8 bits on the serial control as the digital value to convert on channel 3.

Associated with the ABBIE chip 124 are several external components. These include, for transmitting a handset/handsfree switch, a handsfree amplifier and an anti-aliasing filter and, for receiving, an anti-aliasing filter. These perform the anti-aliasing function for the transmit and receive codecs and set the proper relationship between voltage levels at the microphone and handset and the PCM values passed to/received from the DSPs 142, 144. In a later version of ABBIE, these filters are internal.

In addition to the previously mentioned components, three pins/components deserve special attention.

RCPO is the pin on the ABBIE chip 124 at which the receive audio signal is created. A capacitor (not shown) connected between that pin and an analog ground integrates the signal created by the receive codec in ABBIE chip 124. That signal is passed directly to the receive anti-aliasing filter.

REXT is the external resistor that sets the internal bias currents for all analog functions in ABBIE chip 124.

MIDREF is an internally generated 2.5 volt reference. It is used in the dual-mode radio as a reference for the transmit codec.

Any control of either DSP 142, 144 for signalling messages to the base station, volume control, analog or digital mode, etc., is sent directly to the DSPs from the microprocessor 120 via the host interface (unnumbered) of the KATIE ASIC 122.

The digital microprocessor 120 used in the present invention is preferably a Z80. The Z80 was chosen due to its low power consumption and its standard ASIC cell form (for future integration) and its ability to address up to 1 Megabyte of memory by the addition of the on-chip memory management circuitry. The alternative is the Z180 which already includes this memory management.

The Z80 microprocessor 120 runs at the clock rate of the mobile reference oscillator divided by two or 9.72 MHz. Most if its interface to the hardware is "through" the KATIE ASIC 122. The only I/O functions directly connected to the microprocessor 120 are memory accesses, a serial connection to the mobile's handset 132 through a data buffer 130, and the KATIE registers.

There is a real-time operating system (OS) present in the software. The KATIE ASIC 122 generates an OS "tick" every 1 ms on an interrupt pin of microprocessor 120.

As seen in FIG. 4, the KATIE chip 122 interface from the microprocessor 120 (host interface) has common CLOCK, SYNC, and DATA to both DSPs 142, 144. The DATA from the DSPs are separate, one for transmit and one for receive. The CLOCK and SYNC pulses are active continuously in the receive direction (from the DSPs) and only the CLOCK is active continuously in the transmit direction-16 bit words at 75.9375 k bits/sec. In the receive direction, the DSPs 142, 144 just place DATA out when necessary. During downloading of the DSPs 142, 144 this interface is configured to run at 4.86 MHz.

The transmit DSP interface 91 to the modulation waveform section 92 of the KATIE ASIC 124 is only active during transmission of data. Its CLOCK, SYNC, and DATA rates may change depending on which mode the radio is in. During idle mode (control channel) there is no activity on this interface (except for occasional messages to base station). For analog voice mode there are continuous 16 bit words sent at 240 k words/sec. at a burst bit rate of 4.86 MHz. In digital voice mode, the interface transfers 16-bit words at a mean word rate of 194.4K words/sec. To improve the transfer efficiency, words are collected in a buffer in the KATIE chip until eight are available, and then blocks of eight are transferred bit-serially at a burst bit rate of 4.86 MHz.

The I and Q outputs of the modulation waveform section 92 of the KATIE ASIC 124 are differential CMOS outputs, e.g., if I='1' (VCC or 5 volts), Ī is a ground or 0 volts. These bit streams are output at 9.72 MHz and go through a balanced RC filter to create a voltage that is applied to the transmit modulator 115. The use of balanced delta-sigma modulation through balanced filters to drive a quadrature modulator is novel.

Figure 14A:
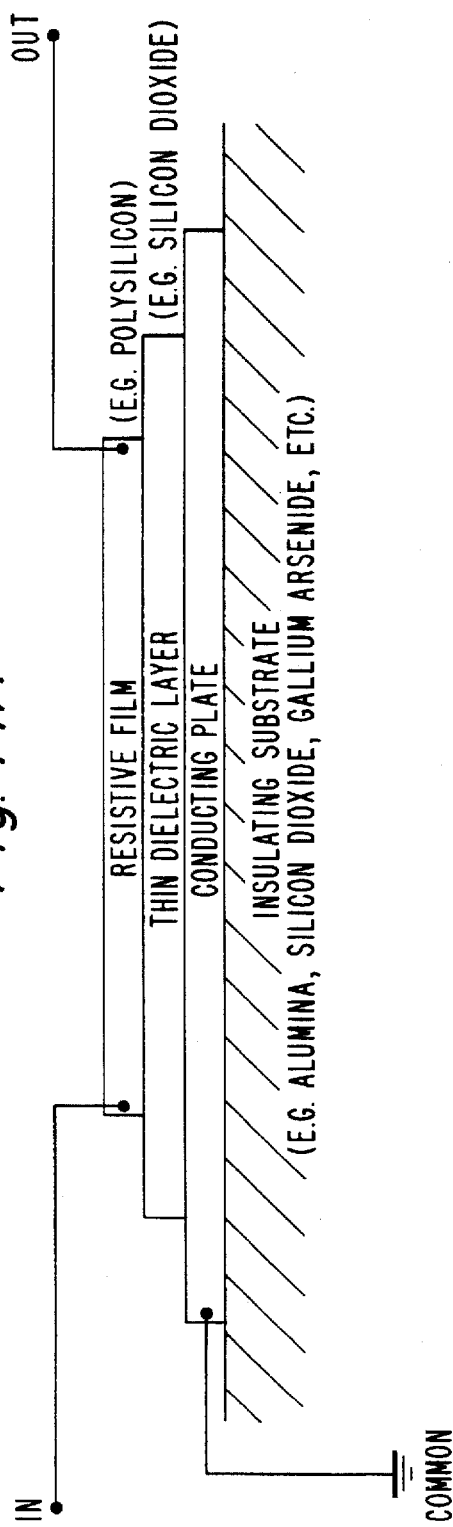
FIG. 14 illustrates the construction and circuit symbol of a distributed RC line.
Figure 14B:
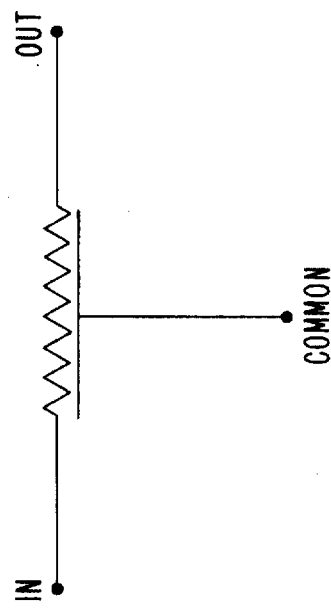

In the preferred embodiment, an inventive balanced filter utilizes the sheet-resistivity properties of deposited conductive films on silicon substrates and the capacitance-per-unit-area properties between films overlapping with an intervening dielectric layer. Resistors are treated as distributed over and insulated from a capacitor plate and thus as a distributed RC line that may be described by the resistance per unit length, capacitance per unit length, and length. The construction and circuit symbol for a distributed RC line is shown in FIG. 14.

Such RC lines have an inherent low-pass type of frequency response that attenuates higher frequencies, but the cut-off is rather gentle. Sharper cut-off low-pass filters generally achieve their characteristics with the aid of notches in the stop band.

It is known that a notch in the frequency response may be formed using a distributed RC line by connecting its capacitor plate terminal to ground through a resistor of specific value. For uniform RC lines, the notch is complete when the resistor to ground circuit has the approximate value 0.056 times the total through-resistance, and the notch frequency is approximately 11.2/RC radians per second, where R is the total through-resistance and C is the total distributed capacitance.

Once a complete or partial notch can be formed, other frequency responses can be synthesized, such as bandstop, or bandpass, the latter by including the notch device in the feedback loop of an amplifier.

Figure 15:
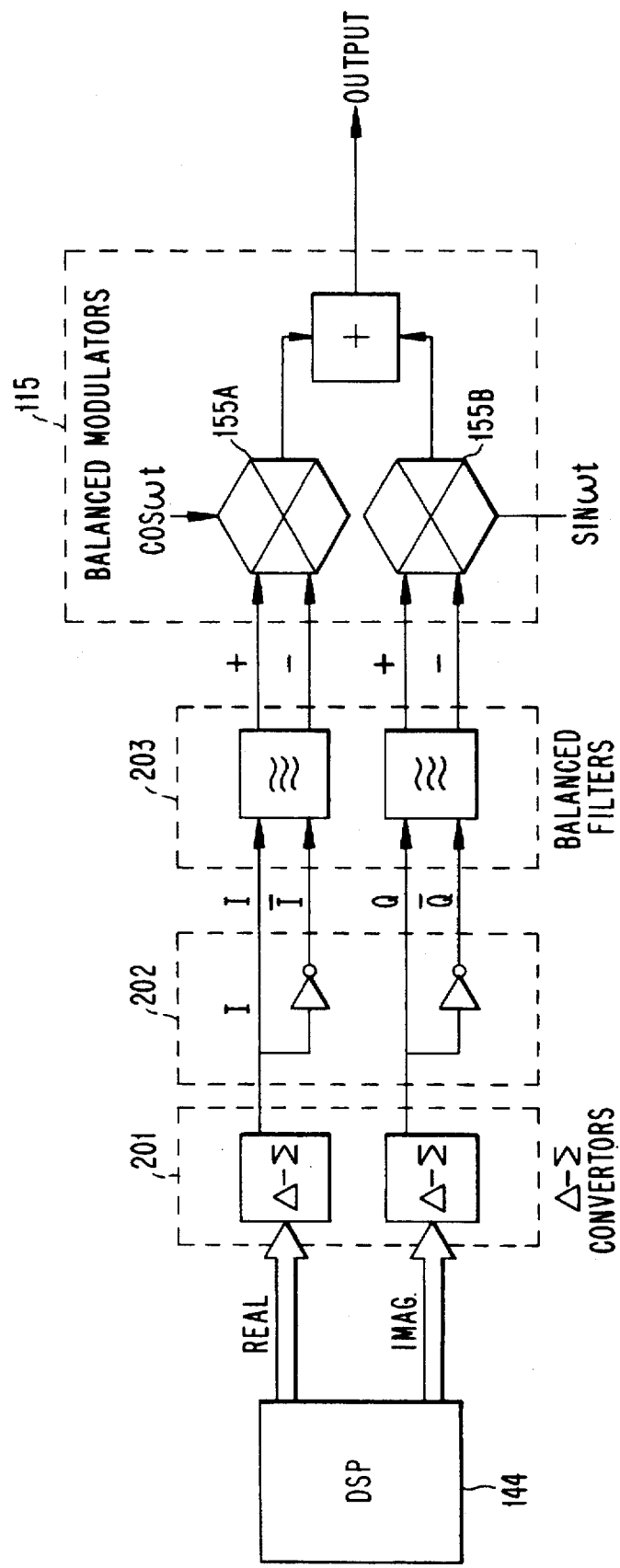
FIG. 15 illustrates a quadrature modulator arrangement.

Matched, balanced, low-pass filters provided in conjunction with a quadrature modulator for the purposes of synthesizing an arbitrarily modulated radio frequency signal are shown in FIG. 15, which uses the novel D to A conversion technique to generate, as well as I and Q signals, their complements.

In FIG. 15, the numerical I and Q signals from DSP 144 are transferred to a delta-sigma convertor 201. This device is built according to known art to generate a high bitrate stream of binary '1's and '0's having a short-term average value proportional to the numerical input value. With a maximum possible numerical input value the bit stream produced would be 11111 ... (the voltage of a '1' condition being equal to the chosen supply voltage) while the minimum numerical input value will generate the bit pattern 0000000 ... A half-scale numerical input will produce the bitstream 1010101010 ... having an average voltage equal to half the supply voltage. According to an aspect of the invention, extra invertor gates 202 are provided at the output of each delta-sigma convertor to generate the complementary bitstreams also. That means when a delta-sigma convertor produces a bit stream 100100100100 ... having a mean of ⅓ the supply voltage, the complementary bit stream will be 011011011011 ... having a mean of ⅔rd the supply voltage. The difference between these two is ⅓–⅔=–⅓ of the supply voltage. If the convertor produces 111011101110 ... having a mean of +¾ of the supply voltage then the complementary signal 000100010001 ... will have the mean ¼, so that the difference is ¾–¼=+½ supply. By using the difference between the convertor output signal and its complement to represent an I or Q signal, the value represented can be positive or negative even with a single positive supply, and no reference voltage need be generated. Consequently the balanced mixers 115A, 115B are provided with balanced, two-wire inputs rather than single-ended inputs, that are responsive to the difference in the signals on the two wires and unresponsive to the absolute or common-mode voltage on the two wires.

High bitrate delta-sigma modulation bitstreams are simply converted to the analog voltage they represent merely by forming the moving average voltage over a large number of bits. This may be done using a continuous-time, low-pass filter having a bandwidth which is a small fraction of the bitrate, but still sufficient to pass all desired modulation components. For the balanced signal configuration developed in this invention, balanced filters 203 are needed between the delta-sigma convertor 201 outputs and the I,Q balanced modulators 115.

The balanced modulators 115 may be constructed is so-called Gilbert mixers.

A basic filter section 203 according to the invention includes two identical RC null devices which provide a low-pass filtering action to both balanced (push-pull) and common mode signals, with a notch in the frequency response. This filter has a common mode attenuation at DC and low frequencies of unity, as there is no resistance to ground. A complete filter design may consist of a cascade of such balanced sections.

A practical problem is how to control in mass production the resistivity of the deposited films to be equal to the value assumed in the design. If the resistivity varies, the whole frequency response scales proportionally. Double the resistivity would halve the cutoff and null frequencies while half the resistivity would double all frequencies. In the case where practical production tolerances are too wide to permit the frequency response to be held within desired limits, the another aspect of the invention may be applied to adjust the frequency response to be within limits after manufacture. This is done by means of an inventive means for stepwise variation of the line length.

Adjustment of the notch frequency is provided by means of a stepwise adjustable line length using an advantageous, inventive configuration. This is used with a matching stepwise adjustable resistor to form the adjustable notch device.

Figure 16:
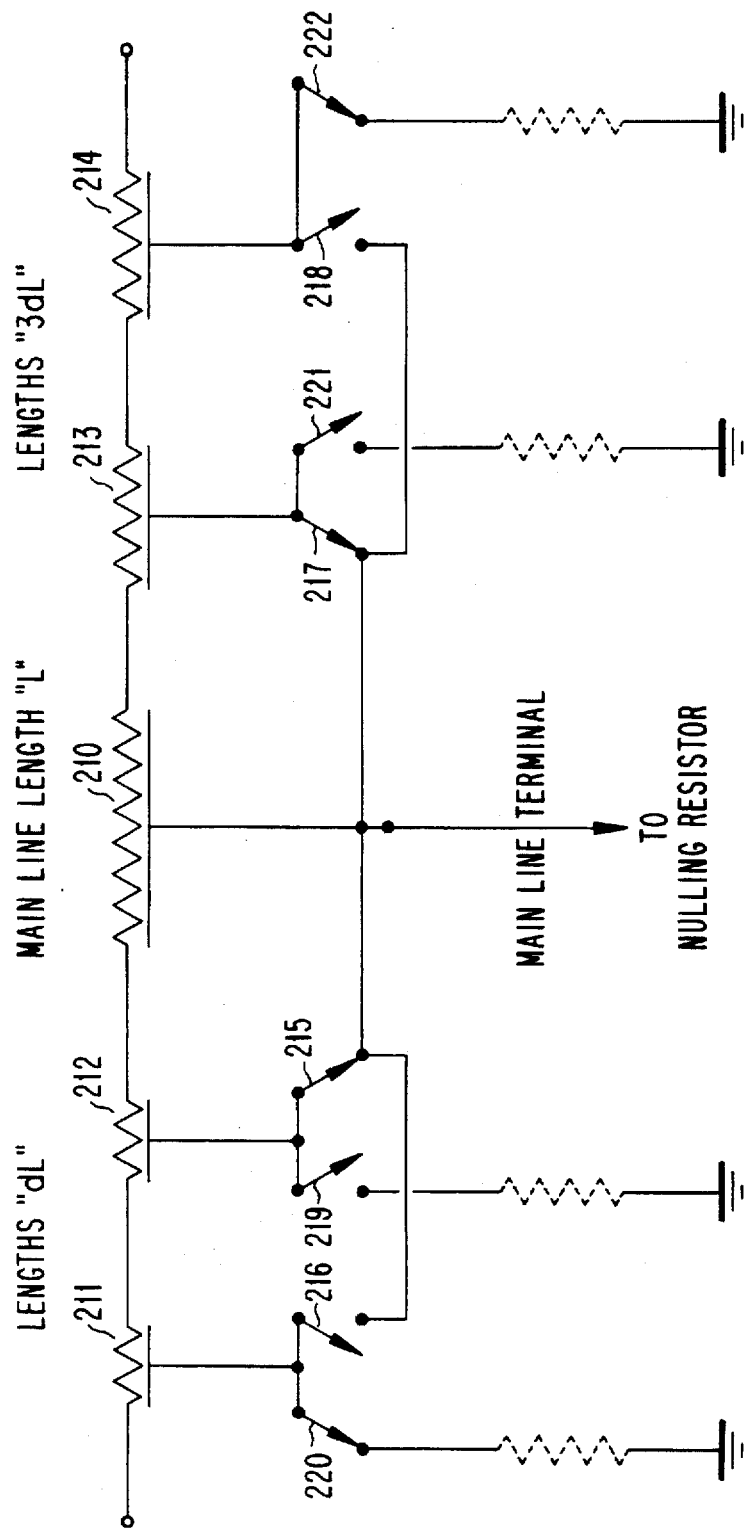
FIG. 16 illustrates a preferred arrangement of a switch-tunable RC null device.

The preferred implementation of the adjustable RC line is shown in FIG. 16. A main, permanently in-circuit line section 210 is cascade-connected with switchable sections on either side. Two switchable sections 211, 212 on the left hand side have linelengths that are a first fraction dL of the main line length L. The two switchable sections on the right 213, 214 have fractional lengths 3 dL. Thus various effective line lengths can be achieved by switching the switchable sections in or out of circuit in the following combinations:

| 211 | 212 | 213 | 214 | Effective line length |
|---|---|---|---|---|
| out | out | out | out | L |
| out | in | out | out | L + dL |
| in | in | out | out | L + 2 dL |
| out | out | in | out | L + 3 dL |
| out | in | in | out | L + 4 dL |
| in | in | in | out | L + 5 dL |
| out | out | in | in | L + 6 dL |
| out | in | in | in | L + 7 dL |
| in | in | in | in | L + 8 dL |

An important feature achieved by the above arrangement is that the line sections switched into circuit are always contiguous, i.e. no combination of lines such as "in out in" is used. This enables simplification of the switching so that the capacitor plates only of the lines need to be switched. To switch a line section to add to the main line length, its capacitor plate is connected to the capacitor plate of the main line. This is done by one of several switches 215–222 (e.g., by a switch 215). To prevent the line section adding to the main line length, its capacitor plate is either left unconnected or connected to ground (e.g., by another switch 219). Optional resistances may be added between the switches 215–222 and ground. The switched out sections therefore appear as separate, short RC lines or series resistors that are in cascade with the device and not additive to the effective main line length. Thus when the main line terminal is connected to ground via the nulling resistor of FIG. 17 the frequency to the null in the frequency response so created is not affected by the switched-out sections.

Figure 17:
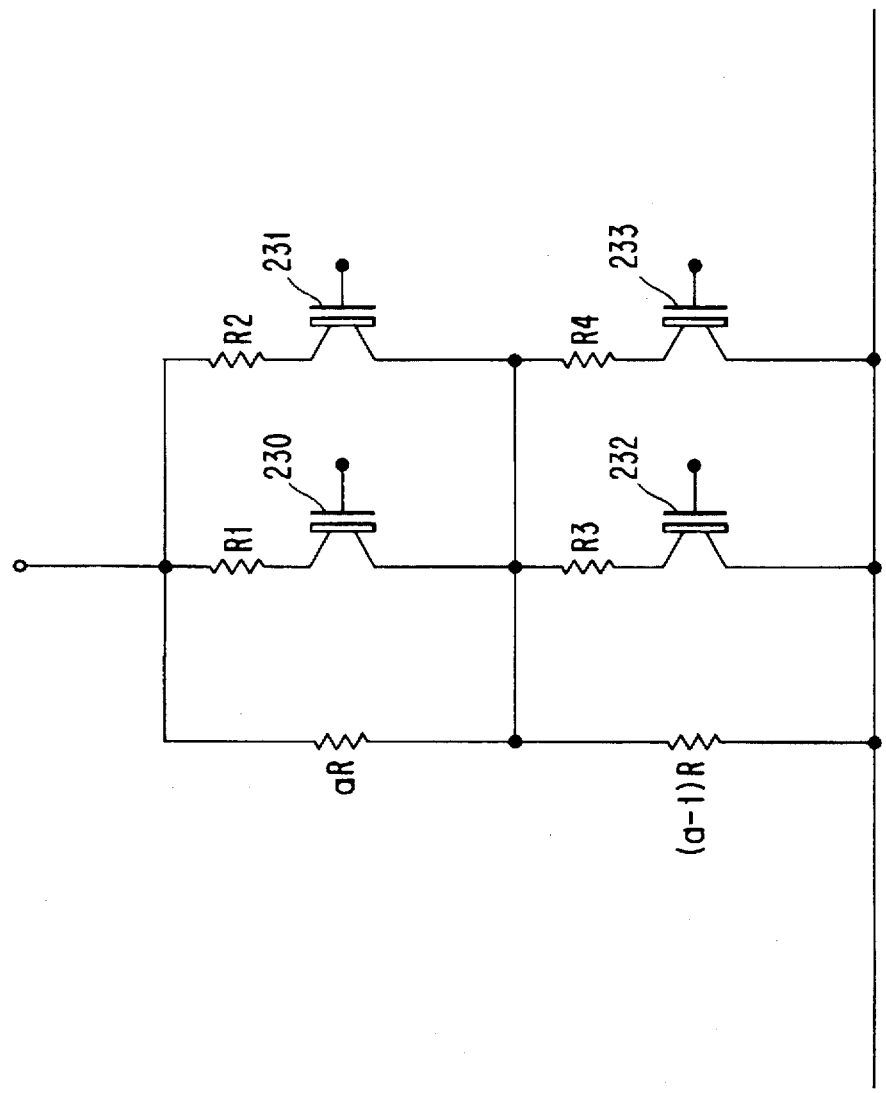
FIG. 17 illustrates a preferred arrangement of a stepwise adjustable nulling resistor for use with the device shown in FIG. 16.

To provide a matching, stepwise-adjustable nulling resistor, the arrangement of FIG. 17 could be used. Here, adjustment of the total effective resistance is accomplished by switched shunt resistors of high value instead of switched series resistors of low value. The main resistor value R in FIG. 17 is divided into a fraction aR and a fraction (a−1)R. In parallel with the first fraction aR are connected two switchable resistors R1 and R2. Switching in R1 will reduce the effective value aR to aR−dR, while switching in both R1 and R2 will reduce the effective value aR to aR−2dR. Likewise the switchable resistors R3 and R4 allow the resistance (a−1)R to be reduced to (a−1)R−3dR or (a−1) R−6dR. Thus all values of total resistance from R to R−8dR in steps of −dR can be achieved. Since the adjustment of R is in the downward direction, the switches (230 to 233) must be operated by inverse control signals to those of switches (215 to 218) of FIG. 16. The value of the fraction "a" may be chosen so that smallest of the four switched resistors R1, R2, R3 and R4 is as great as possible in order to minimize the influence of series switch resistance. If "a" is too small, then R1 and R2 will be unnecessarily small while R3 and R4 are large, and vice versa if "a" is too large. Therefore an optimum exists that can be found by calculation.

The construction of the notch filters and adjustable notch filters and their applications has been described here under the assumption that integration on a silicon integrated circuit is the aim, but it can be readily adapted to other forms of fabrication or applications.

A 600 kHz modulated carrier signal is always present at the input to the receive sample interface 80 part of the KATIE ASIC 122. Depending on the mode of operation, the receive sample interface 80 produces different outputs to the receive DSP interface (unnumbered). The 600 kHz input signal is a hard-limited signal of about 200 mV peak-to-peak. It is a differential signal IF IN and IF IN\.

The three modes that are used in the receive sample interface 80 are for analog control channel mode, analog voice channel mode and digital voice channel mode. The receive sample interface 80 is capable of measuring several different combinations of phase, frequency, and amplitude of the incoming signal. In analog control channel mode, phase samples are sent to the receive DSP 142 using 16-bit words at 80 k words/sec. During analog voice channel mode, phase and frequency information is sent alternately giving 160 k words/sec. For digital voice mode, an 8-bit phase and an 8-bit amplitude sample are packed into a 16-bit word and sent to the receive DSP 142 at a rate of 194.4 k words/sec. All burst bit rates are at 4.86 MHz on this interface.

Figure 5:
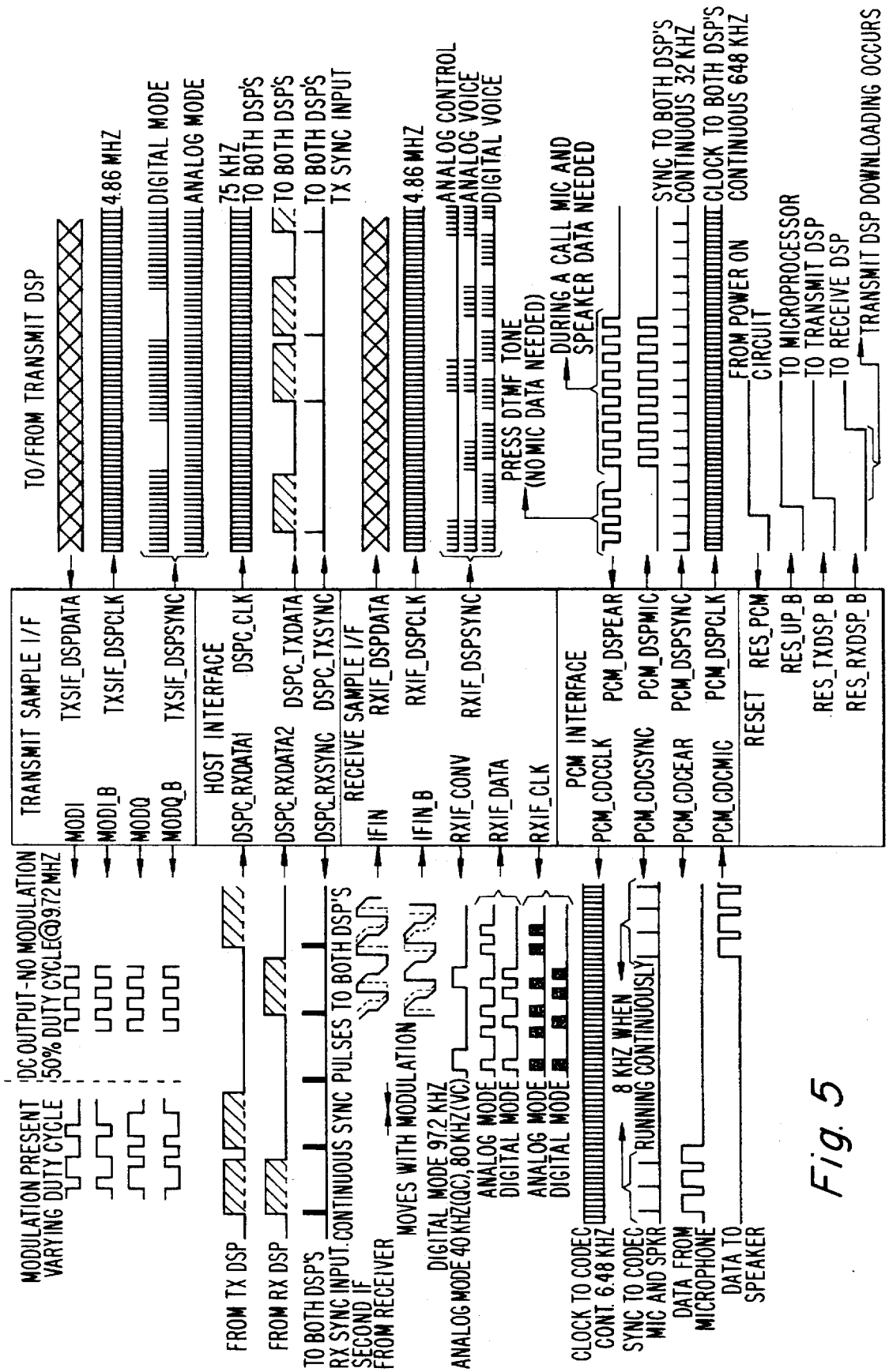
FIG. 5 is a diagram of the KATIE interfaces.

There are two major interfaces between KATIE chip 122 and the ABBIE codec 124 as shown in FIG. 5. One of them is used to send audio data (PCM) to and from the codec of the ABBIE chip 124. The other is a serial communications channel to set various modes and parameters, such as the D to A converter values or digitally controlled volume control values in ABBIE chip 124. The PCM interface of the ABBIE chip 124 requires a burst bit rate of at least 128 kHz to be able to transfer 16 bits speech words at the 8 k sample/sec rate. The PCM interface uses a burst bit rate of 648 kHz, thus having a margin of about five times over the minimum burst bit rate needed.

The serial control interface signals are only active when a parameter in ABBIE is to be changed. The bit rate is 648 kHz and the data format consists of an 8-bit address (parameter designator) and an 8-bit new value. Some addresses refer to control bits for powerdown of unused sections to save power in standby mode.

In a hand portable telephone according to the invention, the microphone and ear-piece are built into the unit. When these in-built audio transducers are employed, no communication with an external handset is necessary. In a mobile (car) phone, however, or when a hand portable unit is temporarily plugged into a vehicle adaptor to adapt it to mobile operation, the microprocessor 120 communicates digital control signals to the external handset or adaptor unit via a Universal Asynchronous Receive-Transmit (UART) interface. Audio signals are sent or received from the external world at an intermediate level of around 100–200 mV RMS using the ABBIE auxiliary audio input and output pins.

The power supply and control logic section 140 of the mobile includes the battery, ground, ignition sense, horn alert output, transpack mode detect handset on/off button and the mobile's internal power hold signal.

Figure 3:
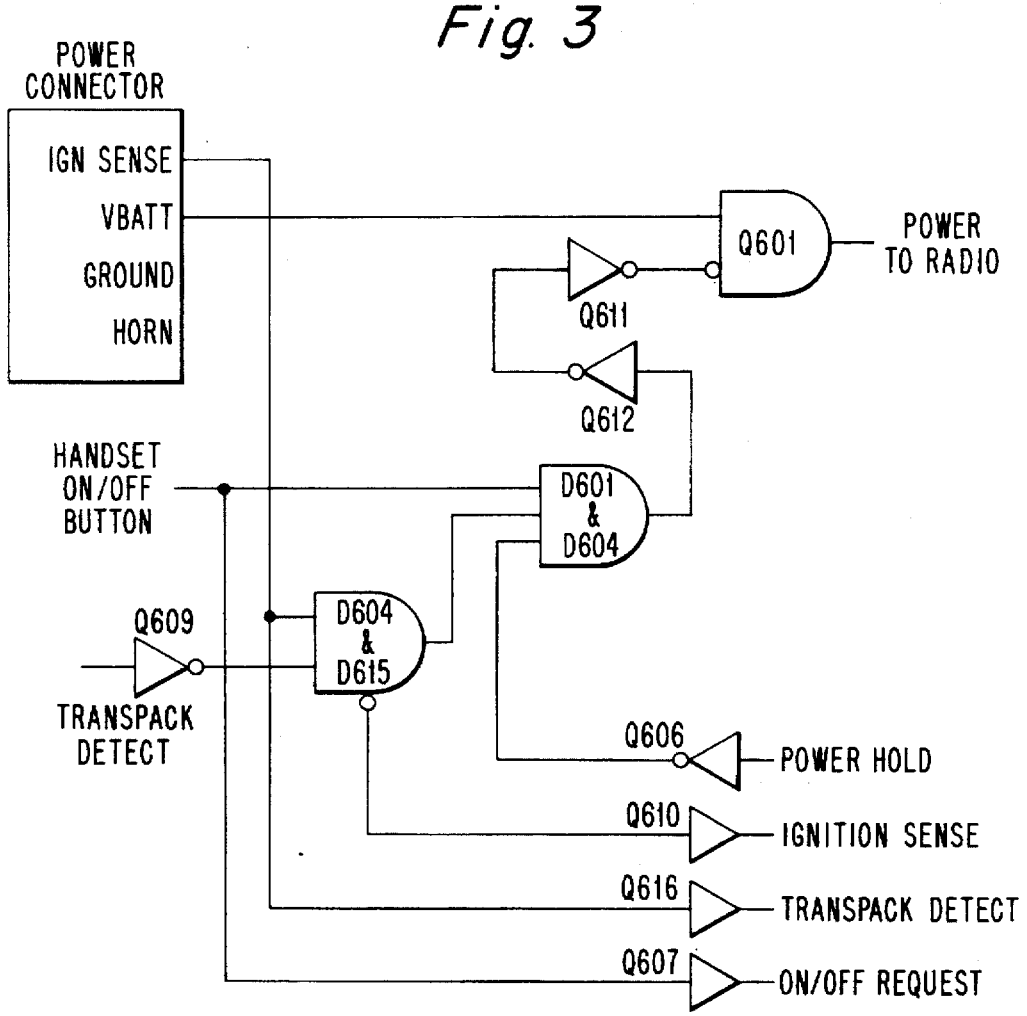
FIG. 3 is the Boolean power control logic of the present invention.

A simplified block diagram with Boolean logic of the power supply is shown in FIG. 3. The basic operation is that if the power button is depressed on the handset, the microprocessor 120 is forced into operation, and checks the ignition sense input. If the ignition sense is on, the mobile will "power up" for the user. If not, the microprocessor will shut down again.

A scenario using the power hold signal might be that the user is in conversation mode and turns off the ignition switch. Sensing the ignition switch is off, the microprocessor 120 keeps power to the mobile with the power hold signal and releases the power hold only when the call has ended-turning off the mobile. If no call is in progress, the lack of ignition sense power would turn off the mobile.

Figure 7:
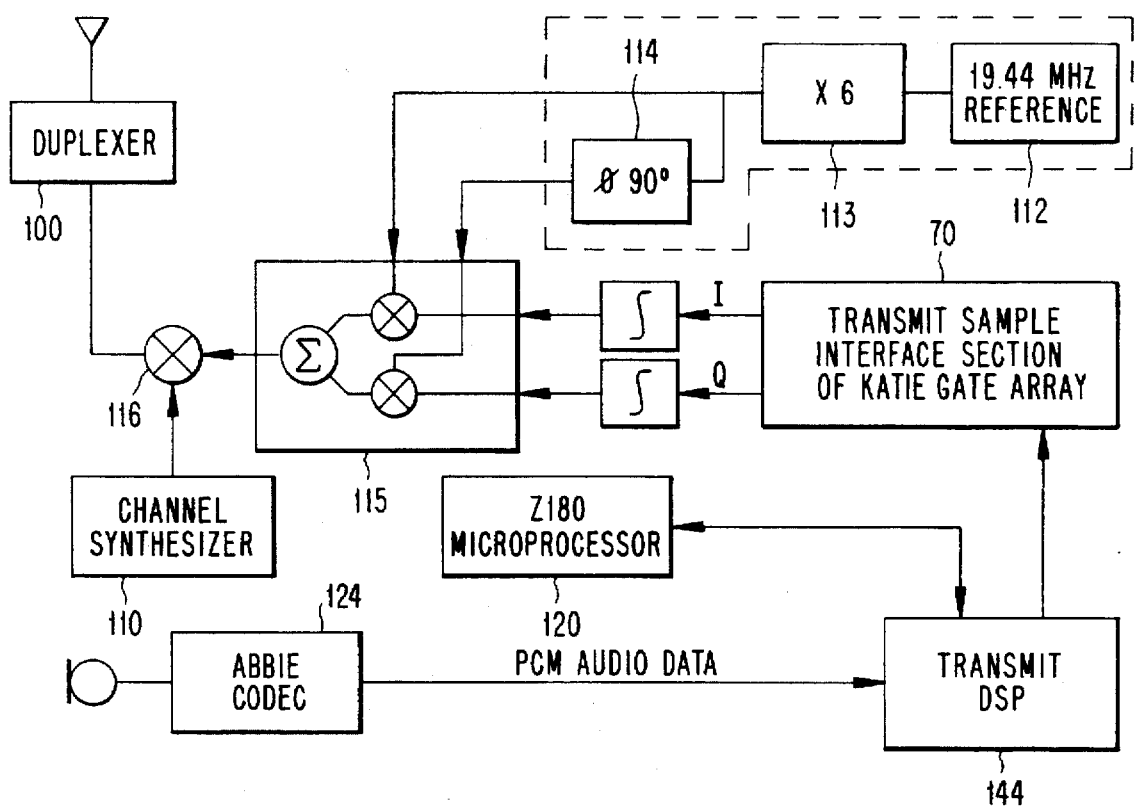
FIG. 7 is a functional block diagram of the transmitter path of the present invention.

FIG. 7 shows a simplified transmit path in the mobile. Audio signals come from the microphone, and are converted to PCM digital data by the ABBIE codec 124. The transmit DSP 144 receives this data, performs gain control, filtering, digital voice coding, error correction coding and burst data formatting, and sends the result to the transmit interface section 70 of the KATIE ASIC gate array 122 to be formed into the correct I & Q signals for modulation by modulators 115. In analog mode, the 8 k samples/sec PCM voice is not reduced by speech coding or subject to error correction coding. Instead, a digital implementation of the AMPS specified 2:1 dynamic range companding algorithm is employed. Samples of the companded waveform are then converted to a frequency modulation waveform and from that to phase samples and ultimately I,Q waveforms, being the COS and SIN of the phase samples respectively.

The I & Q signals are applied to a pair of mixers in modulator 115 with an in-phase and a 90° out-of-phase signal fed in from a phase shifter 114 at a transmit intermediate frequency. These are summed and mixed "up" to the selected channel frequency in mixer 116 to be transmitted out through a duplexer 100. In an alternative implementation, the "up" mixer produces an unmodulated carrier frequency which is then I,Q modulated with the I,Q waveforms.

Figure 8:
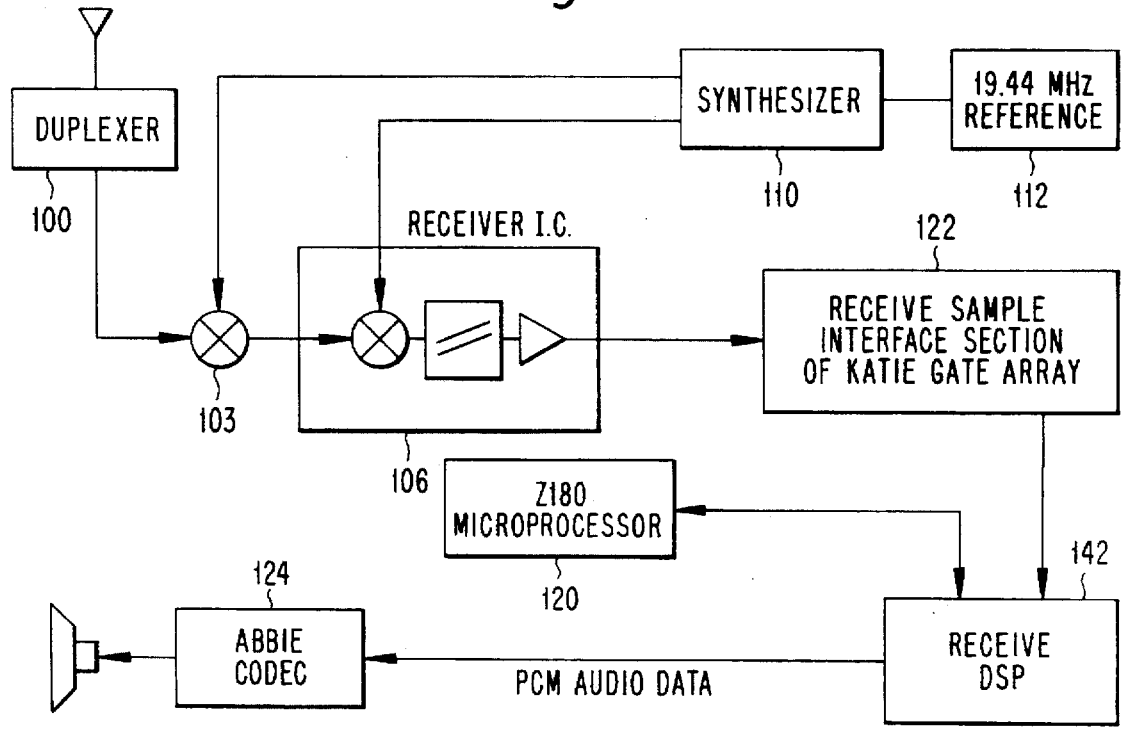
FIG. 8 is a functional block diagram of the receiver path of the present invention.

FIG. 8 is a simplified receive path. The received signal is mixed "down" from the selected channel frequency in a mixer 103 to a "first" IF frequency using a synthesized local oscillator signal. The receiver chip 106 then mixes and filters the signal down to a "second" IF frequency, with the assistance of the synthesizer 110 and reference oscillator 112, the 2nd IF signal then being sampled by the receive sample interface section 80 of the KATIE chip 122. The KATIE chip 122 converts the 2nd IF signal to a series of phase samples and a series of frequency samples and the ABBIE chip simultaneously converts the RSSI signal to a series of amplitude values using its A-to-D convertor. The phase, amplitude and frequency samples are forwarded to the receive DSP 142 for processing. The receive DSP 142 performs demodulation, filtering, gain/attenuation, and in digital mode, channel decoding and speech decompression. The Z80 microcomputer 120 acts as a host interface and provides other control operations of the system.

This demodulated speech data is then sent to the ABBIE codec 124 as PCM samples to be converted to baseband audio for the loudspeaker.

Digital transmission of speech is facilitated by first reducing the speech bit rate from the 8 k sample/sec of 16 bit words provided by ABBIE through use of a VSELP coder. The speech coder provides a number of bits to represent 20 m segments of speech. Bits are classified as Class 1 bits (most significant) or Class 2 bits (least significant). Class 1 bits are subjected to the most rigid forms of error correction convolution coding and error detection by means of a Cyclic Redundancy Check (CRC). These two outputs enter a 2 time slot interleaver with a 260-bit output. Each 260 bit output of the interleaver consists of 130 bits of the previous 20 m speech segment plus 130 bits of the current segment.

Figure 9:
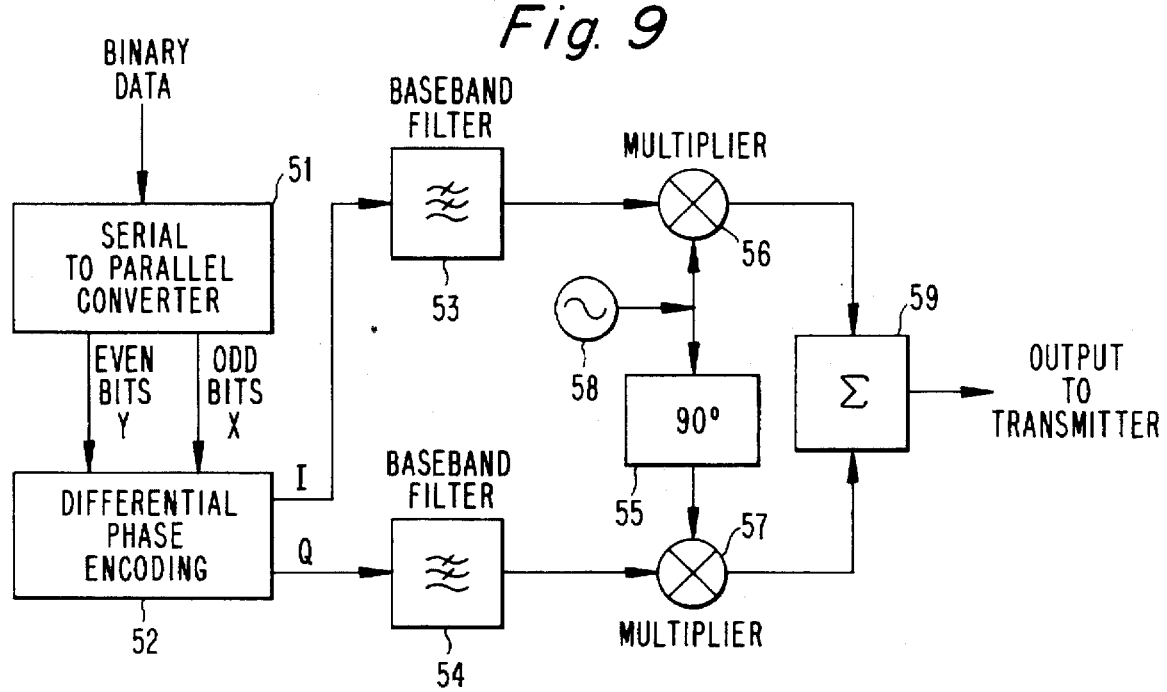
FIG. 9 is a functional block diagram of an interleaver.

This bit stream feeds the input of a serial-to-parallel converter 51 (FIG. 9). The first bit follows the "X" path while the second bit follows the "Y" path, and so on, as shown in FIG. 9.

The next stage, the differential phase encoder 52 groups these bits into pairs (symbols) and translates each pair into one of four signal relative phase changes. For example, a symbol pair 00 represents a 45° phase change, symbol pair 01 a 135° change, 10 a –45° change, and 11 a –135° change. FIG. 9 includes a 90 degree phase shifter 55 between the multiplier stages 56 and 57 as well as baseband filters 53 and 54. The phase shift is applied to the Q signal. I and Q signal values thus represent coordinates of a point on two perpendicular axes, allowing any point to be "arrived" at by appropriate choice of I and Q values.

Figure 10:
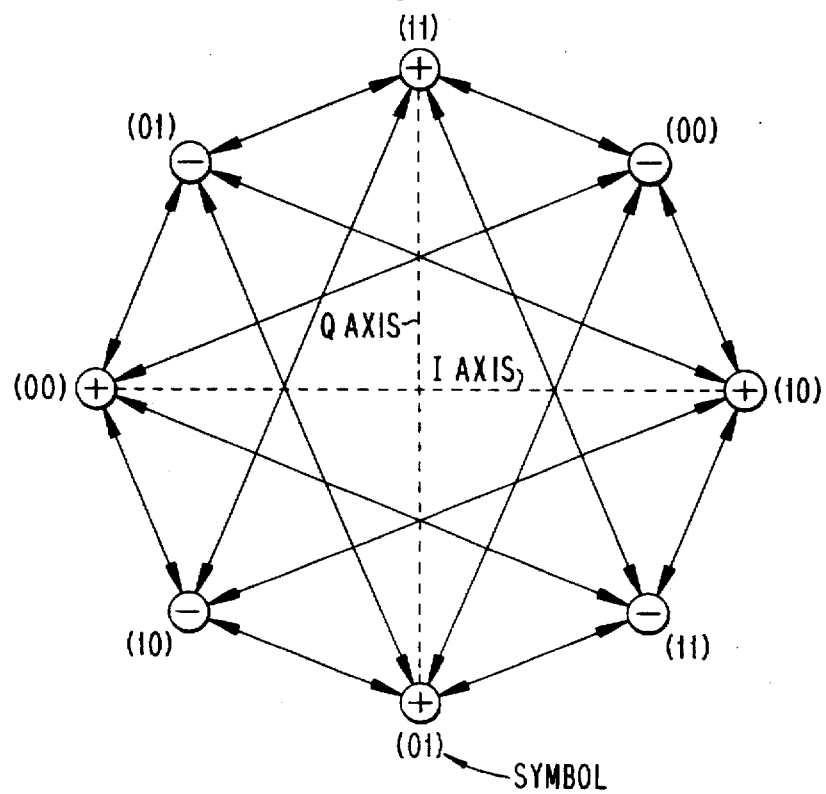
FIG. 10 is a diagram illustrating relative phase changes.

The sequence of I, Q values for each symbol-pair is applied to a Root Raised Cosine filter to generate smooth transitions between points. FIG. 10 shows typical signal trajectories for many symbol-pairs overlayed.

For more detailed information on TDMA standards and compatibility, refer to IS-54.

Demodulation at the receiver is accomplished by means of a channel-adaptive equalizer to provide tolerance of echoes in the signal path. A suitable equalizer may be based on the principles disclosed in U.S. patent application Ser. Nos. 07/894,933 and 07,965848, filed by Paul Dent et al. on Oct. 22, 1992 entitled "Bidirectional Demodulation Method and Apparatus", and European Patent Application 0 425 458 A1, all herein incorporated by reference.

The Operation

Figure 11:
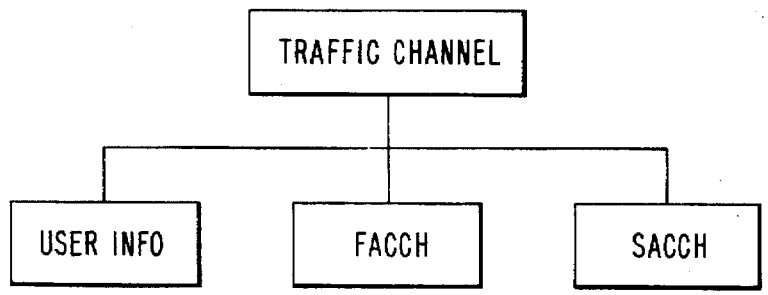
FIG. 11 illustrates the make-up of a traffic channel.

The construction of pulse train and traffic concepts will be discussed in order to better understand the operation of the present invention. The traffic channel is the portion of the digital information transmitted from base to mobile, and mobile to base, and contains user and signalling information as shown in FIG. 11. FACCH (Fast Associated Central Channel) and user information cannot be sent at the same time. The receiver may discriminate between FACCH and user information according to the technic disclosed in U.S. patent application Ser. No. 07/652,544, filed Feb. 18, 1991, herein incorporated by reference. Each TDMA frame consists of 6 slots as illustrated below:

| Slot 1 | Slot 2 | Slot 3 | Slot 4 | Slot 5 | Slot 6 |
|--------|--------|--------|--------|--------|--------|

The entire frame contains 1944 bits (972 symbols) and takes 40 ms to transmit. That equals 324 bits per slot or 162 symbols. All slots are equal in length. 2 bits=1 symbol per the modulation scheme utilized in TDMA, which will be further detailed below.

Each slot includes the following information:

| Mobile to Base Slot Format: | | | | | | | |
|---|---|---|---|---|---|---|---|
| G | R | Data | Sync | Data | SACCH | CDVCC | Data |
| 6 | 6 | 16 | 28 | 122 | 12 | 12 | 122–324 bits |

| Base to Mobile Slot Format; | | | | | |
|---|---|---|---|---|---|
| Sync | SACCH | Data | CDVCC | Data | RSVD |
| 28 | 12 | 130 | 12 | 130 | 12–324 bits |

Each full rate traffic channel will occupy 2 time slots. The grouping will be slot 1 & 4, slot 2 & 5, and slot 3 & 6. There is provision in the future for half rate traffic channels which would only occupy one time slot. Full and half rate can be mixed on the same channel.

In explanation of the symbols used in the slot formats drawn above, the following applies

| G = | Guard time |
|---|---|
| R = | Ramp time |
| SACCH = | Slow Associated Control Channel |
| SYNC = | Synchronization and Timing |
| Data = | User information or FACCH |
| CDVCC = | Coded Digital Verification Color Code |
| RSVD = | Reserved |

Average net data rate is 13 k bit/sec for a full rate digital traffic channel

Mobile RF output is in carrier-off mode during the guard time. Ramp time gives the mobile a 3 symbol duration to reach the power level (PL) ordered by the base station. The mobile must be within 3 dB of assigned PL by the end of the second symbol. When commanded to carrier-off mode, the mobile output falls below −60 db within 3 symbol periods. For example, our mobile is on traffic channel "1 " , and transmitting on slots 1 and 4. During the other slot intervals 2, 3, 5, and 6, the mobile must be off because other mobiles will be transmitting on those other slots or traffic channels which will all be using the same TX frequency and the same receiver back at the base station. Forward and reverse timing are offset.

In the forward direction a 14-symbol sync field is used for slot identification, equalizer training, and synchronization.

T-1 system of time-multiplexed digital speech or data signals is similar to this system inasmuch as each traffic channel is allocated a portion of the total time in a "round robin" fashion. The base station transmits a burst of information to each of three mobiles in turn and then continues with the next burst of information for the first mobile again, and so on. The sync words and CDVCC identify to the mobile which burst it should receive.

In the reverse direction, each of three mobiles transmits in its turn to the same base station receiver; the sync words and CDVCC symbols included in the burst identify to the base station which mobile the burst came from. The difference between the two directions of transmission is that, whereas the base station transmits continuously, each mobile transmits only ⅓ of the time and so its transmission starts and stops. The function of the "ramming" symbols at the beginning and end of the mobile transmit burst are to effect a smooth start and stop to the transmission so that unwanted spectral spreading of the signal into neighboring channels is avoided.

Now it is established that the only thing sendable or receivable on these digital traffic channels is digital data, "1's" and "0's". The phone will need a method for converting all user information into this format, i.e., π/4DQPSK modulation process.

Speech coding is done by a process called Vector-Sum Excited Linear Predictive Coding (VSELP) the details of which appear in the IS-54 system standard specification mentioned above. The VSELP coding is performed by a vocoder implemented in the DSPs; the encoding part implemented in the transmit DSP 144 and the decoding part implemented in the receive DSP 142. The premise behind this method of coding is that due to the repetition of speech and audio waveform patterns, it is not necessary to transmit the entire waveform. It is possible to extract the key components, reconstruction bits and perform error correction (CRC) and still run at a reduced bit rate. At the receive end the signal is reconstructed utilizing information stored in the phone and cell site codebooks. In effect it "fills-in-the-blanks." It is due to this repetition and bit interleaving that small drop-outs of the data cannot be detected by the user.

The speech coder uses Vector-Sum Excited Linear Prediction (VSELP) to compress the 8 k words per second to about 8 k bits/second. The principle is to use knowledge about the repetitive nature of speech to construct a formula with dynamically varying coefficients to represent the speech. These LPC coefficients are transmitted as part of the 8 k bits/second speech. The remainder of the 8 k bits/second is used to transmit information on the so-called "residual" , being the error between the prediction using the formula, and the actual speech waveform. Furthermore, the number of bits needed to represent the residual is reduced by likening 5 mS sections of its waveform to prestored waveforms in a "code book" , and transmitting only the code book entry numbers instead of the whole waveform. Incoming audio first goes through 3 processes to make the A/D conversion which are Level Adjustment, Bypass Filtering, and Analog to Digital Conversion (13-bit resolution).

The audio sampling rate is 8 kHz, once again like a T-1 line.

Call Processing

The following is a detailed explanation of digital call processing. The analog call processing is very similar to the digital call processing, and the following will serve as an explanation of both with various differences noted at appropriate locations.

When operating power is applied, the phone will enter its initialization and self-test routines. The mobile determines from its own programming whether to scan system A or B dedicated control channels. As the mobile scans all 21 primary control channels, it also examines the signal strength. Digital capable base station still use the same analog control channels as before, along with the analog-only mobile stations. The dual-mode phone is still in analog mode at this point.

The mobile now tunes to the strongest dedicated control channel to correctly decode a system parameter overhead message within 3 seconds, for example, and update the number of paging channels, the first paging channel, the last paging channel, enable and set increment for autonomous registration (if mobile is capable), and set the Protocol Capability Indicator (PCI) to the value read from its respective field.

The last mentioned step is where the analog and digital phone begin to differ. PCI is a 1-bit field in the first word of the system parameter overhead message that indicates whether a base station is digital capable. If PCI indicates analog only, the mobile station will enter the scan secondary set of dedicated control channels task. This could be considered an attempt to locate a digital capable base station. This procedure is basically the same as the primary scan. If PCI indicates digital capability the mobile enters a Primary Paging Channel Selection.

If the mobile cannot complete this process on either primary or secondary, then the mobile can look back at its system (A/B) preference and change it if it is enabled, and repeat this process. "NO SERVICE" is the indicated result until the mobile successfully completes this process.

The digital mobile in the service area of a digital base station or cell site then examines the signal strength in the paging channels and enters the Verify Overhead Information task. The mobile sets the Wait-For-Overhead-Message bit (WFOM) to zero. Once again the mobile has 3 seconds to tune to the strongest paging channel, receive the overhead message train, and update the SID-System Identification, the Roam Status (an internal comparison with stored SID), and the Local Control Status (enable/disable).

If the mobile cannot complete this task, then the mobile will attempt it on the second strongest paging channel. If that fails, then the mobile will check A/B select again in an attempt to render service. If all fails, then the mobile goes back to scan primary set of dedicated control channels If the mobile system is successful, it now enters Idle at the Response to Overhead Information task. During the "Idle" task the mobile station will execute the 4 following tasks at least every 46.3 milliseconds:

Response to Overhead Information-such as SID comparison, number of paging channel, read control filler bit, read DTX bit, set roam status, number of access channel, determine control channel boundaries. There is also a CPA bit on this train. If it set to zero, then the access and paging channel tasks somewhat reverse roles. This applies to either mode.

Page Match-Occurs when forward control page message MIN equals mobile MIN. When a match exists, the mobile executes System Access task with a page response indication.

Order-Mobile monitors control messages for orders and must match MIN's to act on the order.

Call Initiation-Mobile indicates call, System Access is entered with an origination request.

System access has time constraints such as an origination of a 12 seconds maximum, a page response of a 6 seconds maximum, an order response of a 6 seconds maximum and a registration of a 6 seconds maximum in the preferred embodiment.

The mobile then examines signal strength on each of the access channels, tunes to the strongest, and enters the Retrieve Access Parameters task. Next, it sets the busy occurrences and seizure attempts limits (10 maximum) and initializes their counters to zero. The read control-filler bit (RCF) is read. If it equals zero, then the mobile must set the DCC, WFOH, SDCC1, SDCC2 to received values and set PL to the value in CMAC field of the message and the station power class. Via the WFOM (wait for overhead message) bit, the mobile will be instructed to either update its overhead information or seize the reverse control channel.

In seizing the RCC (Reverse Control Channel), the mobile first reads the busy idle bit. Presuming it is idle, the mobile turns on the transmitter to the appropriate frequency and once within 3 dB of specified PL, it sends its message to the base station. The message content will be detailed later. A failure at this point will increment the seizure failure counter. If the busy/idle bit on the FCC (Forward Control Channel) changes to busy between the 56th and 104th bit of the mobile's message train, the mobile sends its service request the four types of messages sent on a RCC page response, origination, order confirmation, and order message-are composed (of one or more of five words.

A. Abbreviated Address Word (always sent).

B. Extended Address Word-for digital request, order confirmation, registration, RCF-1, 2-word page (D & E), or change of ROAM status.

C. Serial Number Word.

D. First Word of the Called Address (origination).

E. Second Word of the Called Address (origination).

After sending the complete message, the mobile sends an unmodulated carrier for about 25 ms before turning it off. For an order confirmation, the mobile enters the Serving-System determination which is self explanatory. For the other requests, the mobile has 5 seconds to perform the Await Message task. For the digital capable phones this is an Initial Traffic Channel designation Message which updates its parameters, usually performs autonomous registration update, supplying a "success" indication. Next step for the mobile is the Confirm Initial Traffic Channel Request. Even if the user chooses to terminate at this point, the call will switch to a voice or digital traffic channel to terminate.

In order to go digital, within 100 ms of the receipt of the initial traffic channel designation the mobile tunes to the designated channel, set DVCC to received value, set TX and RX rate to that received by the message field type, set the time slot as indicated, set time alignment offset to reference, and once synchronized, turn on the transmitter in the DTX-high state at line power level designated by the VMAC field of the Traffic Channel Designation Message. The mobile transmits shortened bursts on the channel until a physical Layer Control order with a time alignment setting is received.

For a page response, while still in the DTX-high state the mobile enters the Waiting For Order task. If the 5 second order timer expires the mobile turns off the transmitter and reverts back to system serving determination. If the mobile is in DTX-low state and a forward message is received, then the mobile responds on the Fast Associated Control Channel (FACCH). Within 100 ms of a FACCH or SACCH (slow), the mobile will respond accordingly to the following commands:

Alert with Info-send mobile acknowledge, start waiting for answer task, measure order-measure RF channel Quality (CQM), up to 12, stop measurements-terminate measurements, physical layer control-includes traffic channel power, time alignment, and DTX messages, release-call termination order, maintenance-mobile acknowledge, and Wait For Answer task, audit-mobile acknowledge, wait for order, local control-if enabled, mobile determines action to take, handoff-A/D or D/A, and status request-send status message and wait for order.

In waiting for an answer, the DTX operation is inhibited for 1.5 seconds and alert timer is set to 65 seconds. The following may then happen:

After 65 seconds the timer expires and the transmitter is shut off.

If user answers, then the connect message is sent, the base station should acknowledge, and unit moves to conversation mode. The connect message will be sent to the base up to three times prior to the 65 second time-out.

The mobile may also receive any of the following messages on the FACCH or SACCH.

Alter with information which mobile responds with ACK, remains in Waiting for Answer Mode and resets alert timer.

Other orders are nearly identical to the Waiting For Order listed above.

The next step is to enter the Conversation Mode. If this had been an Origination Access rather than a Response—the path taken several steps earlier—the mobile would have gone directly to the conversation task.

In the conversation mode, once again DTX transmission is inhibited for 1.5 seconds and the mobile remains in high state. Depending on service requests, the following may occur: a Release-User terminates call, flash with information, send DTMF, change preferred service, Message-As before-this may contain handoff or information measurement orders, audits, etc.

To Digital Channel Traffic Channel a handoff involves sending a Mobile ACK, turning off the transmitter, adjusting PL, tuning to new RF channel, setting DVCC to the received value, setting TX and RX digital mode, set time slot to received value, figuring voice codec, setting time alignment set, upon synchronization turning on transmitter, resetting fade timer, inhibiting DTX for 1.5 seconds, remaining in wait for answer state. This is considered a Mobile Assisted HandOff (MAHO) as the mobile performs Channel Quality Measurement ("CQM") which contain Received Signal Strength Indication ("RSSI") and Bit Error Rate ("BER") of channels (12 max) specified by the system including the current traffic channel. The mobile then transmits this information back to the base station for handoff evaluations.

To Analog Voice Channel a handoff involves sending a Mobile ACK, turning off the transmitter, terminating CQM, adjusting the power level, tuning to new channel, adjusting to new SAT, setting to a SCC receive value, turning on the transmitter, turning on ST, and resetting fade timer, then waiting for answer on analog channel.

Upon releasing the mobile returns or remains in DTX-high state, User termination generates release message and the mobile may receive Base Station ACK-turnoff transmitter or Alert messages on the FACCH.

If base station acknowledgement or alert is not received within 500 ms after sending the release, it is retransmitted up to 3 times. With no further acknowledgement the mobile will turn off its transmitter. If base station ACK is received, the mobile will acknowledge prior to turning off its transmitter.

A mobile may transmit further information messages on the FACCH or SACCH. Some messages on the mobile require cell site acknowledgement. If timeout expires before confirmation, the mobile retransmits the message on the same control channel. After a specified number of attempts, the mobile will abort transmission of the message.

When the mobile message requires an acknowledgement from the cell site, the mobile will wait for a confirmation of that message before ending a different message. Channel quality measurements are the exception to this rule.

Supervision is accomplished on the digital traffic channel with the CDVCC, rather than SAT. It is contained in each forward and reverse slot with 255 possible combinations. In DTX-high state, the CDVCC is transmitted at all times. In the DTX-low state, CDVCC is sent with FACCH messages. Time-out intervals are 200 ms for a full rate FACCH and 1200 ms for a full rate SACCH. All reserved bits (RSVD) will be set to "zero".

For digital RF emission requirements, in digital mode the mobile transmit frequency should track within ±200 Hz of a frequency value 45 MHz lower than the corresponding base station transmit frequency. It should not be more than 1 kHz off-frequency during channel switching without inhibiting power output.

Transmit antenna connector output will not exceed −60 dB in the carrier-off condition. When instructed to go to carrier-on condition, the mobile should be within frequency specifications and within 3 dB of specified output power within 2 ms. When instructed to go to carrier-off condition, transmit power must not exceed −60 db within 2 ms.

Total emission power in either adjacent channel will not exceed a level 26 dB below mean output power. Alternate channel emission will not exceed 45 dB below mean output power while channels located ±90 kHz from center will not exceed 60 dB below mean output or −43 dBW, whichever is higher.

Class IV is available for dual-mode phones. This enables the mobile via the Physical Layer Control Message from the base station to drop to power levels "8" or −26 dB, "9" or −30 dB, and "10" or −34 dB.

Digital voice and data signals will use the modulation method known as π/4 shifted, differentially encoded quadrature phase shift keying (π/4DQPSK).

In conclusion, the present invention provides a dual-mode TDMA compliant cellular phone at a reasonable cost to the end user. Implementation of these phones in conjunction with digital carrier equipment will bring needed relief to congested systems, increase airtime revenue, and reduce capital costs for construction.

From the foregoing description of a specific embodiment, others can readily modify and/or adapt for various applications such specific embodiments without departing from the spirit and scope of the present invention. Therefore, such adaptations and modifications should be and are intended to be comprehended within the meaning and usage of equivalents of the disclosed embodiments. It is to be understood that the description and terminology employed herein is for purposes of description and not limitation.

What is claimed is:

1. A multi-mode radio communications apparatus, comprising:

receiver circuit for receiving transmitted signals and for converting said signals into received signals;

a transmit circuit for modulating and transmitting transmission signals;

signal processing circuitry for processing said received signals and said transmission signals, said signal processing circuitry being switchable between analog or digital communication modes; and switching means, operatively connected to said signal processing circuitry, for switching said signal processing circuitry between said analog and said digital communication modes;

wherein a majority of the receiver circuit, transmit circuit and signal processing circuitry processes said received signals and said transmission signals in both said analog and said digital communication modes without using separate signal paths for said received signals in said analog and said digital communication modes.

2. A multi-mode radio communications apparatus, comprising:

receiver circuit for receiving transmitted signals and for converting said signals into received signals;

a transmit circuit for modulating and transmitting transmission signals;

signal processing circuitry for processing said received signals and said transmission signals, said signal processing circuitry being switchable between analog or digital communication modes, wherein said signal processing circuitry includes a transmit digital signal processor and a separate receive digital signal processor; and switching means, operatively connected to said signal processing circuitry, for switching said signal processing circuitry between said analog and said digital communication modes;

wherein a majority of the receiver circuit, transmit circuit and signal processing circuitry processes signals in both said analog and said digital communication modes without using separate signal paths for said received signals in said analog and said digital communication modes.

3. The multi-mode radio communications apparatus according to claim 2, wherein said signal processing circuitry further includes a microprocessor and an application specific integrated circuit (ASIC).

4. The multi-mode radio communications apparatus according to claim 3, wherein said ASIC includes a voice A-to-D and D-to-A converter.

5. The multi-mode radio communications apparatus according to claim 4, wherein said transmit digital signal processor, said receive digital signal processor and said ASIC process said received signals and transmission signals in said analog and said digital communication modes.

6. The multi-mode radio communications apparatus according to claim 5, wherein said switching means includes downloading programming information into said transmit digital signal processor and said receive digital signal processor when said communication modes are switched.

7. A multi-mode cellular radio telephone capable of transmitting analog speech in an analog-FM mode or digital speech in an allocated timeslot of a repetitive time division multiple access (TDMA) frame period, comprising:

means for digitizing a speech signal for transmission to produce a representative stream of numerical samples;

processing means for processing said numerical samples in order to generate I and Q signals representing, in an analog mode, vector components of a continuous frequency modulated radio signal or, alternatively, in a digital mode, representing vector components of a digitally modulated TDMA burst signal; and quadrature modulator means for processing said I and Q signals to obtain, in said analog mode, said continuous frequency modulated radio signal or, alternatively, in said digital mode, to generate said TDMA burst signal in said allocated timeslot.

8. A multi-mode cellular radio telephone according to claim 7, wherein said processing means includes a programmable signal processor comprising program storage means dynamically reprogrammable with instruction to perform said digital mode processing or said analog mode processing according to a mode control signal received from the cellular network.

9. A multi-mode cellular radio telephone capable of receiving digital speech signals or analog speech signals comprising:

down conversion means to convert a received signal to a intermediate signal in a digital speech reception mode and an analog speech reception mode;

vector analog-to-digital conversion means to convert said intermediate signal in said digital speech reception mode and said analog speech reception mode to a stream of complex numbers preserving phase and amplitude information;

numerical processing means capable of processing said stream of complex numbers in said digital speech reception mode and said analog speech reception mode in order to obtain speech samples; and D-to-A conversion means to process said speech samples into an analog signal waveform for driving a speaker.

10. A multi-mode cellular radio telephone according to claim 9, in which said numerical processing means includes a programmable signal processor comprising program storage means that can be dynamically reloaded with a program corresponding either to said digital mode or said analog mode according to a control signal received from a cellular network.

11. A multi-mode cellular radio telephone capable of transmitting analog speech in an analog-FM mode or digital speech in an allocated timeslot of a repetitive time division multiple access (TDMA) frame period in a digital mode, comprising:

means for digitizing a speech signal for transmission to produce a representative stream of numerical samples;

processing means for processing said numerical samples in order to generate at least one transmission signal representing, in analog mode, vector components of a continuous frequency modulated radio signal or, alternatively, in said digital mode, representing vector components of a digitally modulated TDMA burst signal; and modulator means for modulating said at least one transmission signal to obtain, in said analog mode, said continuous frequency modulated radio signal or, alternatively, in said digital mode, to generate said TDMA burst signal in said allocated timeslot.

12. A multi-mode cellular radio telephone according to claim 11, wherein said processing means includes a programmable signal processor comprising program storage means dynamically reprogrammable with instructions to perform said digital mode processing or said analog processing according to a mode control signal received from the cellular network.

* * * * *